(12) United States Patent
Yakunin et al.

(10) Patent No.: US 9,411,238 B2
(45) Date of Patent: Aug. 9, 2016

(54) SOURCE-COLLECTOR DEVICE, LITHOGRAPHIC APPARATUS, AND DEVICE MANUFACTURING METHOD

(71) Applicant: ASML Netherlands B.V., Velhoven (NL)

(72) Inventors: Andrei Mikhailovich Yakunin, Mierlo (NL); Vadim Yevgenyevich Banine, Deurne (NL); Johannes Hubertus Josephina Moors, Helmond (NL); Jan Bernard Plechelmus Van Schoot, Eindhoven (NL); Martinus Cornelis Maria Verhagen, Valkenswaard (NL); Olav Waldemar Vladimir Frijns, Rosmalen (NL); Vladimir Mihailovitch Krivtsun, Troitsk (RU); Gerardus Hubertus Petrus Maria Swinkels, Eindhoven (NL); Michel Riepen, Veldhoven (NL); Hendrikus Gijsbertus Schimmel, Utrecht (NL); Viacheslav Medvedev, Moscow (RU)

(73) Assignee: ASML NETHERLANDS B.V., Veldhoven (NL)

( * ) Notice: Subject to any disclaimer, the term of this patent is extended or adjusted under 35 U.S.C. 154(b) by 29 days.

(21) Appl. No.: 14/372,950

(22) PCT Filed: Jan. 10, 2013

(86) PCT No.: PCT/EP2013/050406
§ 371 (c)(1),
(2) Date: Jul. 17, 2014

(87) PCT Pub. No.: WO2013/107686
PCT Pub. Date: Jul. 25, 2013

(65) Prior Publication Data
US 2014/0375974 A1     Dec. 25, 2014

Related U.S. Application Data

(60) Provisional application No. 61/587,965, filed on Jan. 18, 2012, provisional application No. 61/595,981, filed on Feb. 7, 2012, provisional application No. 61/672,076, filed on Jul. 16, 2012.

(51) Int. Cl.
*H05G 2/00* (2006.01)
*G03F 7/20* (2006.01)
*G21K 1/06* (2006.01)

(52) U.S. Cl.
CPC ........ *G03F 7/70033* (2013.01); *G03F 7/70166* (2013.01); *G03F 7/70191* (2013.01);
(Continued)

(58) Field of Classification Search
CPC ....... H05G 2/003; H05G 2/008; H05G 2/005; H05G 2/006; H05G 2/001; G02B 5/0891; G02B 5/10; G02B 5/1838; G02B 5/1857; G02B 19/0047; G02B 19/0095; G02B 27/4244; G02B 27/0983; G21K 1/062
USPC ...... 250/504 R, 493.1, 396 ML, 492.2, 423 P, 250/426, 492.1, 503.1, 237 G; 355/67, 77, 355/53; 378/119, 34
See application file for complete search history.

(56) References Cited

U.S. PATENT DOCUMENTS 2,920,234 A * 1/1960 Luce ........................ H05H 1/16
164/DIG. 4
3,450,925 A * 6/1969 Johnson ................ H01J 61/125
313/110

(Continued)

FOREIGN PATENT DOCUMENTS

WO    WO 2009/077943     6/2009

OTHER PUBLICATIONS

International Search Report and Written Opinion mailed Oct. 18, 2013 for corresponding International Patent Application No. PCT/EP2013/050406 (19 pages).

(Continued)

*Primary Examiner* — David A Vanore
(74) *Attorney, Agent, or Firm* — Pillsbury Winthrop Shaw Pittman LLP

(57) ABSTRACT

A source-collector device includes a target unit having a target surface of plasma-forming material and a laser unit to generate a beam of radiation directed onto the target surface to form a plasma from said plasma-forming material. A contaminant trap is provided to reduce propagation of particulate contaminants generated by the plasma. A radiation collector includes a one or more grazing-incidence reflectors arranged to collect radiation emitted by the plasma and form a beam therefrom, and a filter is configured to attenuate at least one wavelength range of the beam.

8 Claims, 9 Drawing Sheets

(52) U.S. Cl.
CPC ........ *G03F 7/70575* (2013.01); *G03F 7/70916* (2013.01); *H05G 2/008* (2013.01); *G21K 1/067* (2013.01); *G21K 2201/064* (2013.01)

(56) References Cited

U.S. PATENT DOCUMENTS

| | | | | |
|---|---|---|---|---|
| 7,145,634 B2* | 12/2006 | Muijderman | ....... | G03F 7/70916 355/53 |
| 7,382,436 B2 | 6/2008 | Bakker | | |
| 7,439,530 B2* | 10/2008 | Ershov | .................. | H05G 2/008 250/492.2 |
| 7,482,609 B2* | 1/2009 | Ershov | .................. | H05G 2/003 250/492.1 |
| 8,263,950 B2* | 9/2012 | Soer | .................... | G03F 7/70033 250/492.1 |
| 2003/0051990 A1* | 3/2003 | Spielman | ............. | B01D 53/002 204/158.2 |
| 2004/0264512 A1* | 12/2004 | Hartlove | ................ | H05G 2/008 372/5 |
| 2005/0199829 A1* | 9/2005 | Partlo | ..................... | B82Y 10/00 250/504 R |
| 2005/0254029 A1* | 11/2005 | Banine | ................ | G03F 7/70575 355/53 |
| 2005/0275818 A1* | 12/2005 | Singer | ....................... | G01J 3/18 355/55 |
| 2006/0249698 A1* | 11/2006 | Endo | ...................... | H05G 2/003 250/504 R |
| 2007/0090304 A1 | 4/2007 | Jonkers et al. | | |
| 2008/0001101 A1* | 1/2008 | Wilhelmus Van Herpen | ............... | G03F 7/70925 250/492.2 |
| 2008/0083887 A1* | 4/2008 | Komori | .................... | G21K 1/14 250/504 R |
| 2008/0087840 A1* | 4/2008 | Ueno | ..................... | B82Y 10/00 250/396 ML |
| 2008/0137050 A1 | 6/2008 | Ivanov et al. | | |
| 2009/0095924 A1 | 4/2009 | Kimmel et al. | | |
| 2009/0224181 A1* | 9/2009 | Abe | ..................... | G03F 7/70033 250/504 R |
| 2009/0272919 A1* | 11/2009 | Abe | ..................... | G03F 7/70033 250/504 R |
| 2010/0025600 A1* | 2/2010 | Chavez | ................ | G03F 7/70825 250/504 R |
| 2010/0078579 A1* | 4/2010 | Endo | ...................... | H05G 2/001 250/504 R |
| 2010/0108918 A1* | 5/2010 | Nagai | ................. | G03F 7/70033 250/504 R |
| 2010/0181503 A1* | 7/2010 | Yanagida | ............ | G03F 7/70033 250/504 R |
| 2010/0258748 A1* | 10/2010 | Vaschenko | ............ | H05G 2/003 250/504 R |
| 2010/0294958 A1* | 11/2010 | Hayashi | ................. | H05G 2/006 250/504 R |
| 2010/0328639 A1* | 12/2010 | Jak | ......................... | G02B 5/204 355/71 |
| 2011/0101863 A1 | 5/2011 | Komori et al. | | |
| 2011/0133641 A1* | 6/2011 | Zhokhavets | ........... | H05G 2/003 313/631 |
| 2011/0134405 A1* | 6/2011 | Banine | ................... | H05G 2/003 355/67 |
| 2011/0168925 A1* | 7/2011 | Ceglio | ................... | B82Y 10/00 250/504 R |
| 2011/0170083 A1* | 7/2011 | Scaccabarozzi | .......... | G03F 1/84 355/71 |
| 2011/0242515 A1* | 10/2011 | Ceglio | ................. | G02B 5/0891 355/67 |
| 2012/0146507 A1* | 6/2012 | Yanagida | ............... | H05G 2/003 315/111.01 |
| 2012/0170015 A1* | 7/2012 | Yakunin | ............... | G03F 7/70191 355/71 |
| 2012/0243566 A1* | 9/2012 | Hori | ...................... | H05G 2/008 372/27 |
| 2012/0307224 A1* | 12/2012 | Yakunin | ................. | G02B 5/201 355/71 |
| 2012/0307851 A1* | 12/2012 | Hori | ...................... | H05G 2/008 372/27 |
| 2013/0038926 A1* | 2/2013 | Soer | ....................... | G02B 5/208 359/350 |
| 2013/0062538 A1* | 3/2013 | Kodama | ................. | H05G 2/008 250/504 R |
| 2013/0114059 A1* | 5/2013 | Jak | .......................... | G21K 1/10 355/67 |
| 2013/0153794 A1* | 6/2013 | Wakabayashi | ......... | H05G 2/008 250/504 R |
| 2013/0335816 A1* | 12/2013 | Kierey | .................... | B24B 13/00 359/359 |
| 2014/0152967 A1* | 6/2014 | Ceglio | ................... | G21K 1/067 355/67 |

OTHER PUBLICATIONS

Guido Schriever et al., "Laser-produced plasma versus laser-assisted discharge plasma: physics and technology of extreme ultraviolet lithography light sources", Journal of Micro/Nanolithography, MEMS and MOEMS, vol. 11, No. 2, May 29, 2012, pp. 021104-1-021104-9.

* cited by examiner

--PRIOR ART--

SOURCE-COLLECTOR DEVICE, LITHOGRAPHIC APPARATUS, AND DEVICE MANUFACTURING METHOD

CROSS-REFERENCE TO RELATED APPLICATIONS

This application is the U.S. national phase entry of International Patent Application No. PCT/EP2013/050406, filed Jan. 10, 2013, which claims the benefit of U.S. provisional application 61/587,965, which was filed on 18 Jan. 2012, and U.S. provisional application 61/595,981, which was filed on 7 Feb. 2012, and U.S. provisional application 61/672,076, which was filed on 16 Jul. 2012, which are all incorporated herein by reference in their entireties.

FIELD

The present invention relates to a source-collector device constructed and arranged to generate and collect radiation, a lithographic apparatus comprising such a device, and a device manufacturing method. The present invention also relates to radiation sources for use in a lithographic apparatus, and/or as a part of a source-collector device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured. A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector apparatus for containing the plasma. The plasma may be created, for example, by directing a laser beam at a fuel target of a solid, liquid or gasous material, such as particles of a suitable material (e.g. molten tin) or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector apparatus may include an enclosing structure or chamber arranged to provide a vacuum environment to support the plasma. Such a radiation system is typically termed a laser produced plasma (LPP) source.

A discharge produced (DPP) source generates plasma by a discharge in a substance, for example a gas or vapor, between an anode and a cathode, and may subsequently create a high-temperature discharge plasma by Ohmic heating caused by a pulsed current flowing through the plasma. In this case, the desired radiation is emitted by the high-temperature discharge plasma. During operation, the EUV radiation is generated by creating a pinch.

Generally, a plasma is formed by a collection of free-moving electrons and ions (atoms that have lost electrons). The energy needed to strip electrons from the atoms to make plasma can be of various origins: thermal, electrical, or light (ultraviolet light or intense visible light from a laser).

A known practical EUV source comprises a pair of rotating disk shaped electrodes that are partly immersed in a respective liquid bath. The electrodes are rotated so that liquid material (i.e. the fuel) from the liquid baths is carried along their surface. An ignition source is configured to trigger a discharge-produced radiating-plasma from liquid adhering to the electrode, by a discharge at a location between the first electrode and the second electrode. Typically, one electrode is at a negative potential while the other electrode is at ground or a positive potential. The electrode gap may be relatively small, e.g. of the order of 3 mm, to comply with Paschen requirements. Such a discharge source emits pulses of radiation, each time the discharge occurs. The amount of useful radiation produced depends on the voltage of across the electrodes during the discharge and the duration of the pulse.

SUMMARY

It is desirable to increase the useful power of an EUV source. Alternatively and/or additionally, it is desirable to provide a radiation source, or a source-collector device comprising a radiation source and a radiation collector, that obviates or mitigates one or more challenges of the prior art, whether identified herein or elsewhere, or which provide an alternative to existing sources or devices.

According to an aspect of the present invention, there is provided a source-collector device constructed and arranged to generate a radiation beam, the device comprising: a target unit constructed and arranged to present a target surface of plasma-forming material; a laser unit constructed and arranged to generate a beam of radiation directed onto the target surface so as to form a plasma from said plasma-forming material; a contaminant trap constructed and arranged to reduce propagation of particulate contaminants generated by the plasma; a radiation collector comprising a plurality of grazing-incidence reflectors arranged to collect radiation emitted by the plasma and form a beam therefrom; and a filter constructed and arranged to attenuate at least one wavelength range of the beam.

According to an aspect of the present invention, there is provided a lithographic apparatus, comprising: a source-collector device constructed and arranged to generate a radiation beam, the device comprising: a target unit constructed and arranged to present a target surface of plasma-forming material; a laser unit constructed and arranged to generate a beam of radiation directed onto the target surface so as to form a plasma from said plasma-forming material; a contaminant trap constructed and arranged to reduce propagation of particulate contaminants generated by the plasma; a radiation collector comprising a plurality of grazing-incidence reflectors arranged to collect radiation emitted by the plasma and form a beam therefrom; and a filter constructed and arranged to attenuate at least one wavelength range of the beam. The lithographic apparatus may also optionally include one or more of: a support configured to support a patterning device, the patterning device being configured to impart the beam of radiation with a pattern in its cross-section; a substrate table configured to hold a substrate; and/or a projection system configured to project the patterned beam onto a target portion of the substrate.

According to an aspect of the present invention, there is provided a device manufacturing method, comprising: directing a laser beam onto a target surface of a plasma-forming material so as to form a plasma; trapping particulate contaminants emitted by the plasma; collecting radiation emitted by the plasma and forming the radiation into a beam; filtering the beam to attenuate at least one range of wavelengths; patterning the beam of radiation with a pattern in its cross-section; and projecting the patterned beam of radiation onto a target portion of a substrate.

According to an aspect of the present invention, there is provided a radiation collector comprising a plurality of grazing-incidence reflectors arranged to collect radiation emitted by a plasma and form a beam therefrom and a filter constructed and arranged to attenuate at least one wavelength range of the beam, the filter comprising a diffraction grating formed on the grazing incidence reflectors of the collector, the diffraction grating including grooves parallel to an optical axis of the radiation collector. The radiation collector may form a part of a radiation source, a source-collector device, or a lithographic apparatus.

According to an aspect of the present invention, there is provided a radiation source comprising: a bath constructed and arranged to contain a fuel for use as a plasma-forming material; and a wheel constructed an arranged to be at least partially immersed in, and rotatable within, said fuel, such that a rim of the wheel may be immersed, in use, in the fuel; wherein a surface of the rim is curved across a width of the rim.

The surface of the rim may be curved outwardly away from a center of the wheel.

According to an aspect, there is provided a source-collector device constructed and arranged to generate a radiation beam, comprising: a first chamber and a second chamber, gas, in use, being allowed to pass from one of the first chamber and second chamber to the other of the first chamber and second chamber; the first chamber housing a plasma formation location (i.e. a location of a target to be targeted by, for example, laser radiation); the second chamber housing a grazing incidence radiation collector arranged to collect radiation generated, in use, at the plasma formation location, and to form a beam therefrom; the source-collector device further comprising a contaminant trap constructed and arranged to reduce propagation of particulate contaminants generated at the plasma formation location to the grazing incidence radiation collector, the contaminant trap being located in-between the plasma formation location and the grazing incidence radiation collector; the first chamber being arranged, in use, to contain gas at a first pressure, and the second chamber being arranged, in use, to contain gas at a second pressure.

The first pressure may be higher than the second pressure.

The first chamber may comprise a gas inlet for introducing gas into the first chamber, and/or a gas outlet for removing gas from the first chamber.

The inlet may be arranged to direct gas substantially along an optical axis of the collector, and/or toward the plasma formation location.

The second chamber may comprise a gas outlet.

The contaminant trap may be constructed and arranged to allow gas to pass from one of the first chamber and second chamber to the other of the first chamber and second chamber.

The device may be configured such that gas may only pass between the first and second chambers via the contaminant trap.

The first chamber and second chamber may be at least partially defined by a division in a housing, and the contaminant trap may provide an aperture in that division.

The first chamber and second chamber may be at least partially defined by separate housings, and the contaminant trap may provide a conduit between the separate housings, via which radiation and/or gas may pass.

According to an aspect of the present invention, there is provided source-collector device constructed and arranged to generate a radiation beam, the device comprising: a target unit constructed and arranged to present a target of a plasma-forming material; a first laser configuration arranged to generate a first beam of radiation directed, in use, onto the target to form a modified target; a second laser configuration arranged to generate a second beam of radiation directed, in use, onto the modified target so as to form a radiation generating plasma from said plasma-forming material; a radiation collector comprising one or more grazing-incidence reflectors, and arranged to collect radiation emitted by the plasma and to form a beam therefrom.

The first and the second laser configuration may be the same or different configurations.

The first and/or second beam of radiation may be directed, in use, substantially along an optical axis of the radiation collector and onto the target or modified target.

The first and second beam of radiation may be directed, in use, substantially along the optical axis of the radiation collector, and in substantially the same direction along that optical axis.

The first and second beam of radiation may be directed, in use, substantially along the optical axis of the radiation collector, and in substantially opposite directions along that optical axis.

The first beam of radiation and the second beam of radiation may have, in use, directional components along the optical axis of the radiation collector that are opposite to one another.

The second beam of laser radiation may be, in use, directed toward the modified target substantially at an angle of greater than 0 degrees and less than 90 degrees with respect to the optical axis of the radiation collector.

The first and/or second beam of radiation may be, in use, directed toward a side of the target or modified target that faces away from the radiation collector, defined herein as the front side of the target.

The first and/or second beam of radiation may be, in use, directed toward a side of the target or modified target that faces toward the radiation collector, defined herein as the back side of the target.

A debris mitigation arrangement may be located in-between a location of the target and the radiation collector. In any embodiment, the arrangement may be a foil trap or the like, or may take the form of a gas buffer, or operate according to electrical or magnetic principles.

The first and/or second radiation beam may be, in use, directed to pass through the radiation collector and/or the (or a) debris mitigation arrangement, and onto the target or modified target.

The debris mitigation arrangement may be a stationary or rotatable contamination trap. The first beam of laser radiation, and/or the second beam of laser radiation, may be directed, in use, along and through a hollow axis of the contamination trap, and onto the target or modified target.

The first beam of laser radiation may be configured (e.g. most likely in terms of its angle of incidence, but possibly in terms of its power, or some other property) to ensure that the modified fuel target is elongated in a direction substantially perpendicular with respect to the optical axis of the radiation collector. The modified target may provide a flatter, wider or larger target than the initial target on which the first laser beam is incident. For example, the modified target may be or present a disc-like cloud and/or surface.

The device may further comprise a filter constructed and arranged to attenuate at least one wavelength range of the beam. The filter may comprise one or more gratings.

According to an aspect of the invention, there is provided a radiation source comprising: a container arranged, in use, to contain a volume of plasma-forming material, a surface of that volume defining a target of plasma-forming material; a electrode located adjacent the container, and arranged in use to facilitate an electrical discharge between the electrode and the target to generate a radiation generating plasma.

The radiation source may further comprise a laser unit constructed and arranged to generate a beam of radiation directed, in use, onto the target so as to form a cloud of plasma-forming material substantially in-between the target and the electrode.

The formation of the cloud may be arranged to facilitate the production of (e.g. make possible, make easier, or, in one example, trigger the discharge) a radiation generating plasma.

The radiation source may further comprise a voltage source connected to the electrode and/or the volume of plasma-forming material and arranged, in use, to establish a potential difference between the electrode and the volume of plasma-forming material.

According to an aspect of the invention, there is provided a source-collector device constructed and arranged to generate a radiation beam, the device comprising: the radiation source of any the preceding aspect of the invention; and a radiation collector arranged to collect radiation emitted by the plasma and to form a beam therefrom.

The source-collector device may further comprise one or more of: a contaminant trap constructed and arranged to reduce propagation of particulate contaminants generated by the plasma; and/or a filter constructed and arranged to attenuate at least one wavelength range of the beam.

According to an aspect of the invention, there is provided a method of generating radiation, the method comprising: providing an electrical discharge between an electrode and a volume of plasma-forming material contained in a container, the discharge being sufficient to create a radiation generating plasma from the plasma-forming material.

The method may comprise directing a beam of radiation at the plasma-forming material to form a cloud (which is to be understood as including at least a vapor) of plasma-forming material substantially in-between the electrode and the volume of plasma-forming material. This may take place before the discharge, or during the discharge.

The formation of the cloud may trigger the discharge.

The discharge may be provided, at least in part, by providing a potential difference between the electrode and the volume of plasma-forming material that is sufficient to result in the discharge.

According to an aspect of the invention, there is provided a lithographic apparatus comprising the radiation collector, the radiation source, and/or the source collector device as described herein in accordance with other aspects of the invention.

The radiation source or source-collector device (which may be a radiation source in conjunction with a collector) described herein may further comprise, where appropriate, one or more of, or a combination of: a target unit constructed and arranged to present a target surface of plasma-forming material; a laser unit constructed and arranged to generate a beam of radiation directed onto the target surface so as to form a plasma from said plasma-forming material; a contaminant trap constructed and arranged to reduce propagation of particulate contaminants generated by the plasma; a radiation collector comprising a plurality of grazing-incidence reflectors arranged to collect radiation emitted by the plasma and form a beam therefrom; and a filter constructed and arranged to attenuate at least one wavelength range of the beam.

The lithographic apparatus described herein may also optionally include one or more of: a support configured to support a patterning device, the patterning device being configured to impart the beam of radiation with a pattern in its cross-section; a substrate table configured to hold a substrate; and/or a projection system configured to project the patterned beam onto a target portion of the substrate. An illuminator may also be provided for conditioning of the radiation beam prior to that beam being incident on the patterning device.

BRIEF DESCRIPTION OF THE DRAWINGS

These and other aspects are described in more detail with reference to the drawings, in which.

DETAILED DESCRIPTION

Figure 1:
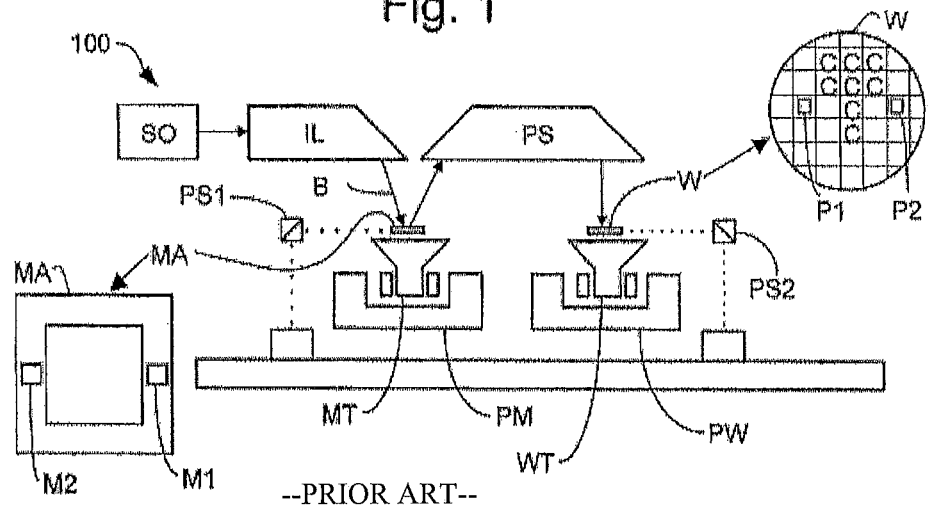
FIG. 1 depicts a lithographic apparatus according to an embodiment of the invention.

FIG. 1 schematically depicts a lithographic apparatus 100 including a source collector apparatus SO according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source-collector apparatus SO described further below. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the desired plasma can be produced by irradiating a fuel, such as a droplet, stream or cluster of material having the desired line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a $CO_2$ laser is used to provide the laser beam for fuel excitation.

In such cases, the laser is not considered to form part of the lithographic apparatus and the radiation beam is passed from the laser to the source collector apparatus with the aid of a beam delivery system comprising, for example, suitable directing mirrors and/or a beam expander. In other cases the source may be an integral part of the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
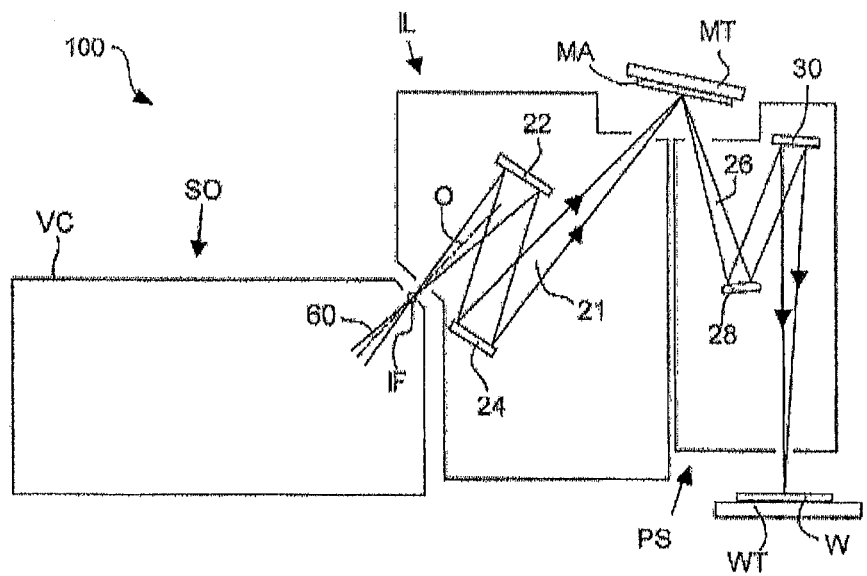
FIG. 2 is a more detailed view of the apparatus of FIG. 1.

FIG. 2 shows the apparatus 100 in more detail, including the source collector apparatus SO, the illumination system IL, and the projection system PS. The source collector apparatus SO is constructed and arranged such that a vacuum environment can be maintained in an enclosing structure VC of the source collector apparatus SO. EUV radiation can be produced by a gas or vapor, for example Xe gas, Li vapor or Sn vapor in which the very hot plasma is created to emit radiation in the EUV range of the electromagnetic spectrum. Partial pressures of, for example, 10 Pa of Xe, Li, Sn, Gd, Tb vapor or any other suitable gas or vapor can provide efficient generation of the radiation. In an embodiment, a plasma of excited tin (Sn) is provided to produce EUV radiation. Further details of the source collector apparatus are given below.

In an embodiment, radiation 60 generated by the source collector apparatus SO is focused in a virtual source point IF. The virtual source point IF is commonly referred to as the intermediate focus, and the source collector apparatus is arranged such that the intermediate focus IF is located at or near an opening on optical axis O in the enclosing structure VC. The virtual source point IF is an image of the radiation emitting plasma.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown can generally be present in illumination optics unit IL and projection system PS. Further, there may be more mirrors present than those shown in the Figures, for example there may be from one to six additional reflective elements present in the projection system PS than shown in FIG. 2.

Figure 3:
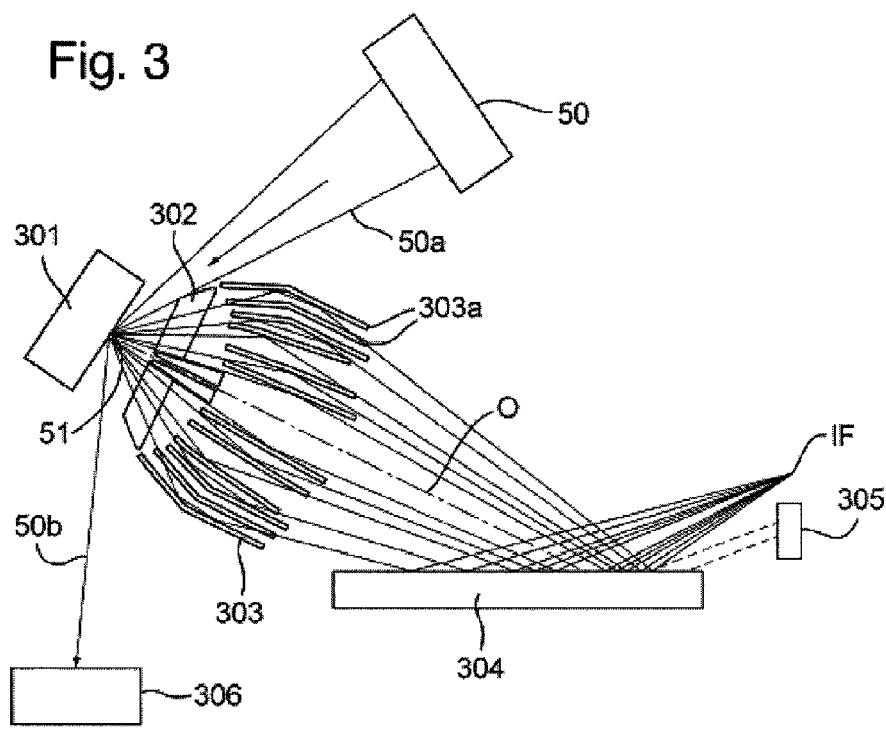
FIG. 3 depicts a radiation source device according to an embodiment of the invention.

FIG. 3 shows in more detail an embodiment of the source-collector apparatus SO. An excitation laser 50 directs a beam of radiation onto a target 301 to generate a plasma 51. Plasma 51 emits radiation, including EUV radiation. At least the EUV radiation is collected by collector 303 and directed, via spectral purity filter 304, to intermediate focus IF. The structure and functions of the components are described further below.

In an embodiment, target material is evaporated and ionized to form a plasma 51 at a well-defined location, i.e. the location where the laser beam hits the target 301. The precise location of the plasma can be controlled by the excitation laser 50. This is desirable for the stability, i.e. homogeneity, of output of the source device and may have an influence on the constancy of the radiation power of the device. In the plasma, ions and free electrons are produced by collisions. Plasma electrons excite electrons in the ions in the plasma and radiation is emitted when those electrons return to the unexcited states. When the liquid material is chosen from gallium, tin, indium or lithium or any combination thereof, the radiation includes large amounts of EUV radiation. The radiation emanates in all directions and is collected by radiation collector 303.

The target 301 presents a substantially flat surface of material on which the laser beam generated by excitation laser 50 is incident. Desirably, the material forming the incident surface is continually replenished. The target material may be a liquid, e.g. liquid tin, lithium, gallium, indium, gadolinium or terbium. In an embodiment, the target material is a liquid metal. Devices that can be used to present the flat target surface include a liquid bath, a liquid bath with a current therein, a liquid jet, a liquid bath with a lifting device, a drop generator and a rotating bath or dish. However, although a substantially flat target surface has the advantage of higher conversion efficiency into EUV radiation, small targets such as small droplets are also suitable for being used with this and further embodiments according to the invention described below.

The use of a substantial flat target increases the amount of material available to form the EUV-emitting plasma and increases conversion efficiency. Conversion efficiency with a flat target as used in embodiments of the invention can be as high as 5% to 6% compared to 1% to 3% for sources using small droplets as target. In an embodiment, a substantially flat surface of target material has a minimum (i.e. the smallest) dimension of the target surface being greater than or equal to 10 µm, desirably greater than 40 µm. Desirably the minimum dimension of the target surface is less than 100 µm, for example in a range from about 90 to about 100 µm. Examples of the minimum dimension may be a diameter of a droplet/jet/solid wire target, or a width of a sheet-like target such as a sheet of solid or molten tin, or a width of a liquid material layer on rotating disk shaped electrodes. The maximum size of the target surface is less important and may be determined by the focusing accuracy of the laser and thermodynamic considerations relating to generation of the liquid metal.

As well as the desired radiation, a plasma such as formed by the excitation laser 50 often omits comparatively large amounts of debris, e.g. ions, atoms and larger particles of the target material. It is desirable to prevent such debris travelling into the rest of the lithographic apparatus where it may damage other components. In an embodiment of the invention, a contaminant trap unit 302 is provided. Contaminant trap unit 302 in an embodiment takes the form of a rotating foil trap. A rotating foil trap comprises a plurality of spaced-apart vanes radiating from an axle aligned with the optical axis O of the source-collector apparatus. The vanes are driven to rotate by a motor (not shown). The speed of rotation of the rotating foil trap is determined so that debris particles emitted from the plasma are swept up by the vanes; there is insufficient time for a debris particle to pass between the vanes before that gap is swept by the rotating vanes. Electromagnetic radiation is substantially unaffected by the rotating foil trap as it presents a very small area viewed from the radiation source point. The rotating foil trap or other contaminant trap is in an embodiment of the invention combined with other debris mitigation devices, for example a gas barrier. A gas barrier comprises a low background pressure of a suitable gas, e.g. argon, hydrogen or helium, and/or a stream of gas across the path of the radiation. A gas barrier in an embodiment of the invention is used only to provide mechanical suppression of debris. Therefore, a wide choice of suitable gasses is available. In an embodiment, a rotating foil trap can be combined with a stationary foil trap.

The radiation that passes through the contaminant trap unit 302 is collected by collector 303. In an embodiment, collector 303 is a nested collector comprising grazing incidence reflectors 303a which are disposed axially symmetrically around optical axis O. Collector 303 focuses the collected EUV radiation 60 at intermediate focus IF, from where it enters the illumination module IL.

Between the collector 303 and intermediate focus IF, a spectral purity filter 304 is provided. Spectral purity filter 304 is shown as a near-grazing incidence reflector which also acts to fold the beam. The filter 304 is provided with a grating that diffracts at least one range of wavelength, e.g. infrared or deep ultra-violet (DUV), to a beam dump 305. Other alternative means to remove the unwanted radiation are also suitable for this purpose, such as coatings or membranes which absorb the unwanted radiation and reflect the desired (EUV) radiation. By removing unwanted radiation from the projection beam, the heat load in the subsequent modules, in particular in the illumination module IL, is reduced.

In the arrangement shown in FIG. 3, the plasma initiation laser beam is directed onto the target unit 301 from a position away from the optical axis O of the collector module. This can be referred to as off-axis irradiation. As a result, the reflected radiation 50b that is not absorbed on creation of the plasma does not enter the collector 303. This reduces the heat load on the collector 303 and prevents this additional unwanted radiation from entering the further parts of the optical train. A beam dump 306 can be provided to absorb the reflected radiation 50b. In an embodiment, the plasma initiation laser can be directed onto the target unit from other directions, including directions on the optical axis, in front of or behind the target unit relative to the collector. In an embodiment of the invention, a plurality of laser beams are used to initiate the plasma. The plurality of laser beams can be a pre-pulse to evaporate a cloud of material and a main pulse to form a plasma and cause EUV emission. A plurality of laser pulses can be applied simultaneously from the same or different directions to form the plasma, with or without a pre-pulse.

In an embodiment of the invention, such as depicted in FIG. 3, the useful power at the intermediate focus IF can be increased compared to known discharge produced plasma sources and laser produced plasma sources using normal incidence collectors and small droplets as target for several reasons. Embodiments of the present invention can provide increased conversion efficiency, i.e., conversion of the input laser power to EUV radiation emitted by the plasma. Compared to a discharge plasma source, embodiments of the present invention can have a higher transmission through the foil trap due to the better localized plasma source. Compared to a discharge plasma source, there is also a better etendue match for the system optics. Compared to a laser produced plasma source, embodiments of the present invention may have a similar overall efficiency but better elimination of contaminants.

Figure 4:
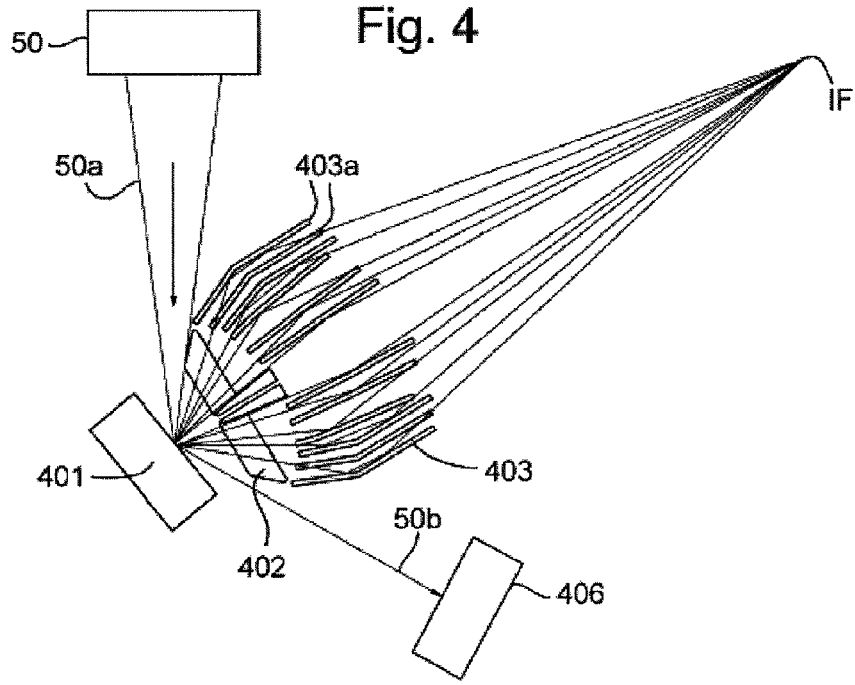
FIG. 4 depicts a radiation source device according to an embodiment of the invention.

An embodiment of the present invention is depicted in FIG. 4. This is a variant of the embodiment of FIG. 3 and components in FIG. 4 referenced with numbers beginning 4 are equivalent to the corresponding components of the embodiments of FIG. 3. One difference between the embodiments of FIGS. 3 and 4 is that in the embodiment of FIG. 4, the spectral purity filter is not used. Instead, a spectral purity filter is combined with the grazing incidence collector 403 (not shown). In an embodiment, gratings are formed on the reflective surfaces of the grazing incidence reflectors 403a so as to deflect the unwanted radiation, e.g. infrared and DUV, away from the intermediate focus IF. Beam dumps (not shown) can be positioned at suitable locations to absorb the unwanted radiation without interfering with the desired radiation passing to the intermediate focus. In an embodiment, a grating is formed on the grazing incidence reflectors 403a or the grazing incidence collectors 403 to deflect the desired EUV radiation to the intermediate focus. The contour of the grazing incidence reflectors 403a may be different if a grating to deflect the unwanted radiation is provided, but the overall effect is the same. With the grating provided on the grazing incidence reflectors 403a, the optical path of the desired radiation beam is not folded necessitating a different physical arrangement of components.

Figure 9:
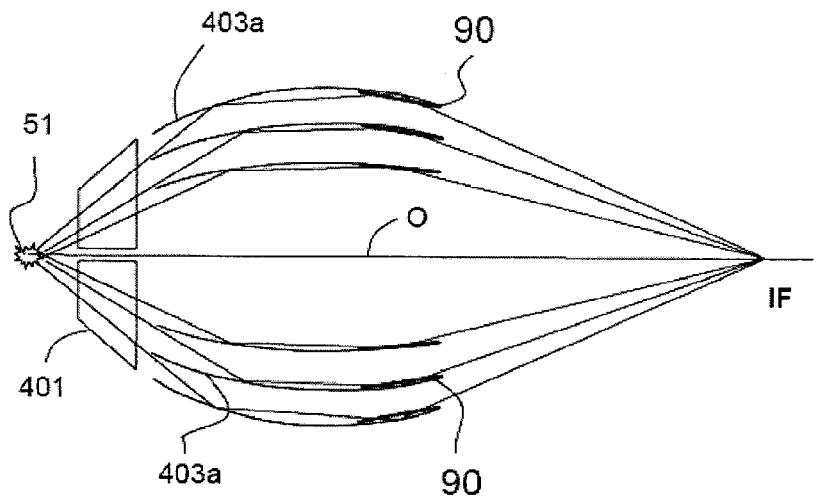
FIG. 9 depicts an embodiment of a grazing incidence collector having gratings to divert undesired radiation.

In an embodiment as illustrated in FIG. 9, the grating formed on grazing incidence reflectors 403a is depicted by lines 90 and is arranged to deflect unwanted infrared radiation away from the intermediate focus IF, and comprises grooves parallel to the optical axis O of the collector 403. The grooves may have any shape provided they are effective in suppressing the unwanted radiation. The grooves may have for instance a rectangular shape in cross section transverse to the direction of the optical axis O. The depth D of the grooves provides destructive interference following the relation:

$$D/\lambda_R = 0.25/\cos(\alpha) \quad (2)$$

In equation (2), $\alpha$ is the angle of incidence with respect to the normal of the collector mirror surface carrying the grating, and $\lambda_{IR}$ is a wavelength of the infra red radiation to be suppressed.

The applied angles of incidence may be, for example, arranged between about 70 degrees and about 80 degrees, and corresponding groove depths are then in the range of about 10 μm to about 20 μm.

The period of the groove is determined by a desired suppression ratio and dependent on this can be in the range of 10 μm to cm's. A desired period is about 1 mm, and a desired duty cycle of the grating (i.e., the groove modulation) is desirably about 1:1.

A method to manufacture the gratings with grooves parallel to the optical axis of the collector includes: depositing a Ruthenium layer on a released shell (i.e. grazing incidence reflector) 403a; depositing an etch stop layer, e.g. a layer of Hafnium; depositing a Ruthenium layer with about 10-20 μm thickness; depositing a second etch stop layer having a groove pattern; etching away Ruthenium in the grooves of the second etch stop layer, and removing the second etch stop layer.

Another option is to make the grooves in another material, e.g. by electroforming Ni, and depositing the Ruthenium on top.

FIGS. 5 to 8 depict alternative forms of target units 301, 401 that can be used in an embodiment of the invention. Each of these devices provides a large (i.e. substantially flat, as discussed above) target surface for the plasma-generating laser beam 50a to enhance conversion efficiency. In these figures, like parts are denoted by like reference numerals.

Figure 5:
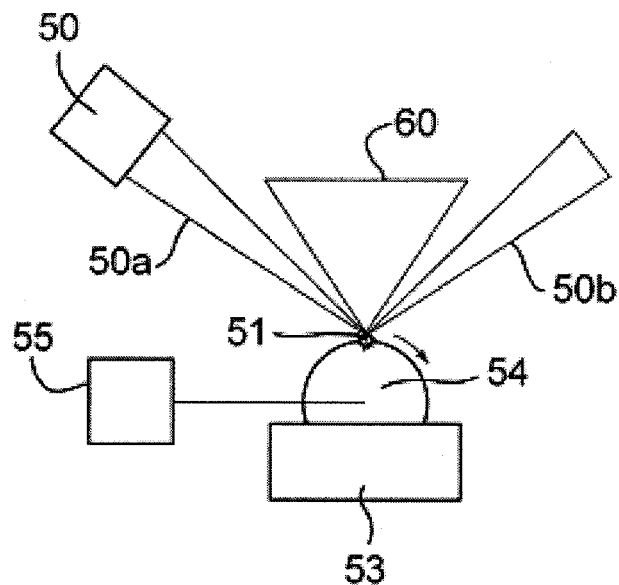
FIGS. 5 to 8 depict source modules usable in a radiation source device according to embodiments of the invention.

In the target unit of FIG. 5, a bath 53 holds a supply of plasma-forming material, e.g. a liquid metal. The bath includes suitable heating and temperature control systems to maintain the metal at an appropriate temperature, dependent upon the metal being used. A wheel 54 is driven by a motor 55 to rotate. The wheel 54 is partially immersed in the bath 53 of liquid metal and as it rotates draws out metal to provide material to form the plasma. Excitation laser 50 is focused on a suitable location on the circumference of wheel 54, e.g. the top, and forms a plasma from the material brought there by the wheel 54. The wheel 54 delivers the plasma-forming material in a suitable flat surface area and ensures continual replenishment thereof. The wheel is made of a material having a higher melting point than the plasma-forming material. An electrode 60 located adjacent to the target is arranged in FIGS. 5-8 such that, in use, an electrical discharge is facilitated between the electrode 60 and the plasma-forming material in order to generate a radiation generating plasma therefrom.

Figure 6:
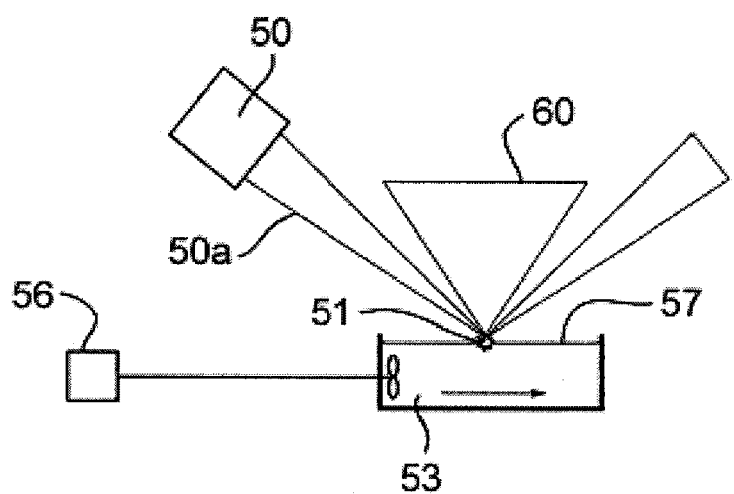

FIG. 6 shows a target unit in which the wheel is omitted and the excitation laser 50 is directed onto the surface of the liquid material in bath 53. A pump or impeller 56 creates a current in the liquid 57 to ensure that the material at the surface is replenished at the desired rate.

Figure 7:
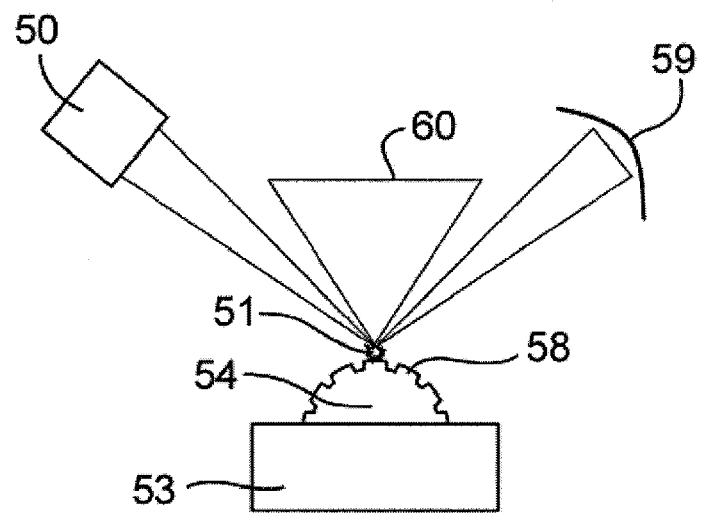

FIG. 7 shows an arrangement in which the target is located within the laser cavity of the excitation laser 50. Mirror 59, which is desirably arranged to be selectively reflective in the wavelength range of the laser, forms one mirror of the laser cavity; the other mirror is contained within the excitation laser 50. Wheel 54 is provided with teeth 58 and fulfills two functions. As well as transporting plasma-forming material to form the target surface, the presence or absence of a tooth at a predefined position controls laser triggering. The device can be configured so that either the presence of a tooth or a gap at the target position allows the laser to discharge. There are several ways this can be done. In one arrangement, the presence or absence of the tooth at the predetermined position alters the optical path length of the laser cavity to prevent or allow resonance. In another arrangement the surfaces of the teeth 58 and/or the gaps between them are oriented such that the presence of a tooth at the predetermined position directs light to the mirror 59 whereas a gap does not, or vice-versa. In such a device, the delivery of fresh plasma-forming material is automatically synchronized with the laser pulse.

A toothed wheel such as shown in FIG. 7 can also be used in an embodiment of the invention in which the target unit is not located within the laser cavity. The teeth of a toothed wheel are desirably shaped to improve plasma formation and increase conversion efficiency. Alternatively to the toothed wheel also a wheel having holes can be used for the same purpose in both embodiments (i.e. located within or outside the laser cavity). In a toothed wheel or in a wheel having holes, it is desirable to provide at least one cavity within which the plasma-forming material can be collected. There can be one cavity extending around the circumference of the wheel or a plurality of cavities spaced around the circumference of the wheel. The excitation laser may be focused into a cavity which serves to confine the plasma-forming material for the duration of the laser pulse, thereby increasing the amount of energy absorbed by the plasma-forming material. The conversion efficiency is thereby increased.

Figure 8:
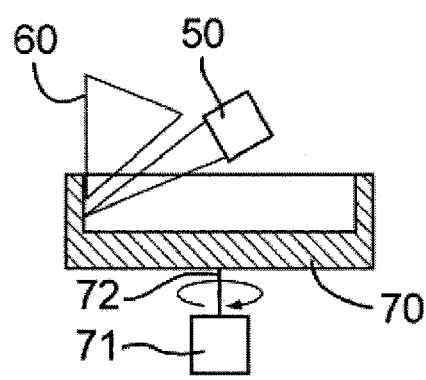

In the device depicted in FIG. 8, the target unit comprises a dish (or a bath) 70 that is driven to rotate by motor 71 via shaft 72. Liquid material to form the plasma coats the side walls of the dish and so the rotation of the device ensures that fresh material is continuously presented to the excitation laser 50.

Figures 10, 11:
FIG. 10 schematically depicts a detail of a wheel of the source modules shown in FIGS. 5 and 7.
FIG. 11 schematically depicts a modification of the wheel shown in and described with reference to FIG. 10, in accordance with an embodiment of the present invention.

FIG. 10 schematically depicts a part of the wheel 54 already shown in and described with reference to FIGS. 5 and 7. The wheel 54 is shown as viewed from a radial direction, such that a width of the wheel 54 is visible. It can be seen that a surface defining a rim 500 of the wheel 54 extends straight across the width of the wheel 54—i.e. the surface of the rim 500 is flat in a direction transverse to the radius and circumference of the wheel 54. When the wheel 54 is rotated, fuel in which the wheel is at least partially immersed may move away from side faces of the wheel 54 to the rim 500, due to centrifugal forces. However, it has been found that fuel does not evenly coat the flat rim surface 500. Instead, it has been found that ridges or the like of fuel will form on the rim, for example at the edges of the rim 500 and at numerous different locations across the rim 500. Experiments have shown that these ridges or the like of fuel do not easily coalesce into a film (or other covering) that extends across the flat rim surface 500. A film, or other uniform coating, would be desirable when the fuel is to be targeted by a laser for plasma formation (i.e. laser produced plasma principle) or for at least partial expansion or vaporization, through which a discharge may be used to generate a radiation generating plasma (discharge produced plasma principle). It is clearly desirable to ensure that there is a continuous film or the like of fuel across the rim 500, so that when laser radiation is incident on the rim 500, fuel is present for targeting by the laser.

FIG. 11 schematically depicts a potential solution to the abovementioned issue. According to an embodiment of the present invention, the rim 502 of the wheel 54 defines a surface that is curved across a width of the rim 502—i.e. curved in a direction that is transverse to the radius and circumference of the wheel 54. The curvature of the rim 502 is outward, and away from the center of the wheel 54. However, in other embodiments (not shown), the curvature may be inward towards the center of the wheel 54.

Using the embodiment shown in FIG. 11, it has been found that the centrifugal force applied to the fuel in which the wheel 54 is at least partially immersed will drive the fuel across the rim surface, and towards the center of the curvature of the rim 502. This enforces coalescence, which may result in a good and consistent coating of the rim 502 with fuel. In more detail, the film (or the like) of fluid forms on the rim 502 due to a balance of centrifugal forces and surface tension forces acting on the fuel, the curved rim 502 allowing this balance to be struck, or more readily struck. If needed, a wiper element can be used adjacent to the rim and/or other surfaces of the wheel to further control the width of the fuel film by wiping off the excess fuel. The wiper may follow the curvature of the rim in order to provide an even more uniform layer thickness.

The embodiments shown both in FIGS. 5 and 7 are laser produced plasma radiation sources. However, the wheel shown in FIG. 11 is not limited to use in a laser produced plasma radiation source—the wheel can be used in a different type of radiation source, for example a discharge produced plasma radiation source, where a laser is incident on fuel on the rim to initiate the formation of a radiation generating plasma.

Figure 12:
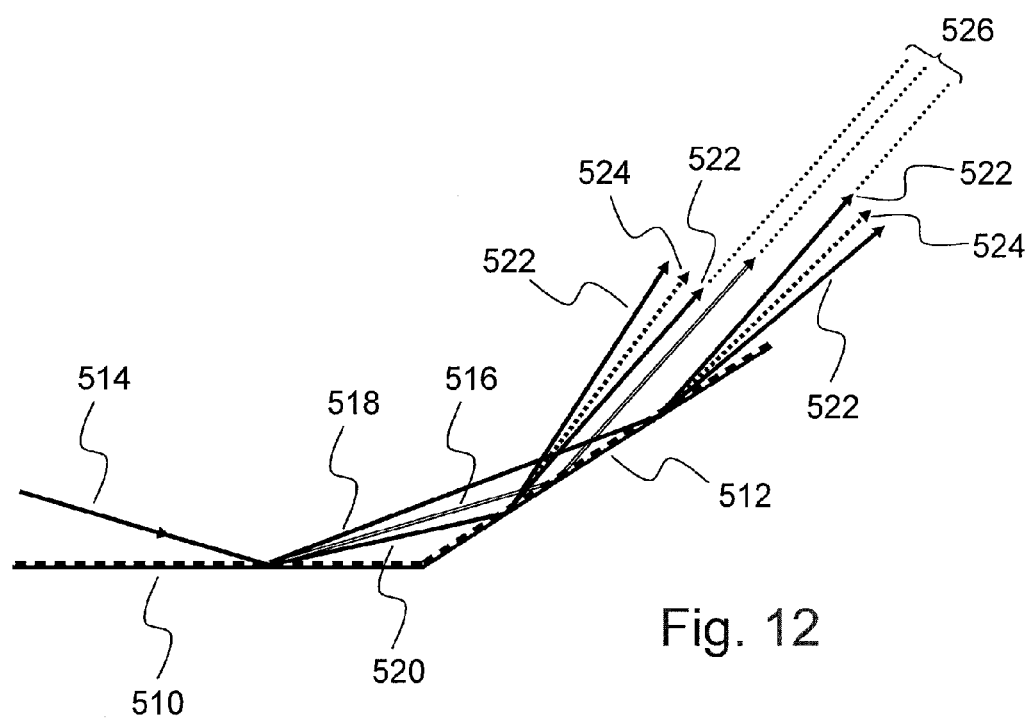
FIG. 12 schematically depicts filtering principles associated with the use of multiple gratings, in accordance with an embodiment of the present invention.

As discussed above, and in particular in relation to the embodiments shown in and described with reference to FIGS. 4 and 9, gratings may filter or otherwise attenuate certain undesired wavelengths of radiation. Attenuation may be a reduction in intensity of undesired radiation (e.g. DUV or infrared radiation), or, most likely with a grating based filter, a diffraction of undesired radiation into certain diffraction orders, the maximum intensity orders being diffracted away from a propagation path of desired (e.g., EUV) radiation. Gratings can indeed be used to suppress undesired wavelengths of radiation from propagating through, for example, a lithographic apparatus, as already discussed in relation to the embodiments of FIGS. 4 and 9. However, if radiation is diffracted from one grating and onto another, downstream, grating, care should be taken to ensure that the suppression provided by the first grating is not adversely affected (e.g., obviated or mitigated) by the second, downstream, grating. FIG. 12 schematically depicts such a potential issue in more detail.

Referring to FIG. 12, a first grating 510 and a second grating 512 is shown. The periodicity of each of the gratings 510, 512 is the same. A radiation beam 514 is shown as being directed toward the first grating 510. The radiation beam 514 comprises radiation of a first wavelength (e.g., EUV radiation) and radiation of a second, different (e.g., longer) wavelength (e.g., infrared radiation). Both the first grating 510 and second grating 512 are configured to substantially reflect incident radiation of the first wavelength, and to substantially diffract radiation of the second wavelength. As is generally the case in diffraction gratings used to suppress radiation of a certain wavelength, the first grating 510 diffracts the vast majority of radiation of the second wavelength into first and higher diffraction orders. Radiation diffracted into the zeroth order, which corresponds to the same direction as undiffracted (that is, reflected) radiation is generally suppressed, in order to avoid undesired (second wavelength) radiation from propagating along the same beam path as the desired (first) wavelength radiation. This is how attenuation/filtration is achieved.

FIG. 12 shows that the first grating 510 reflects radiation of the first wavelength 516 onto and towards the second grating 512. At the same time most of the radiation of the second wavelength is diffracted into +/− first diffraction orders 518, 520 (or higher orders, the first orders alone being shown for clarity reasons), both of which first diffraction orders 518, 520 are also directed towards and incident upon the second grating 512.

Referring to the situation at the second grating 512, the incident first wavelength radiation 516 (reflected by the first grating 510) is simply reflected off the second grating 512. At substantially the same time, incident radiation that was diffracted from the first grating 510 (e.g. first diffraction order radiation 518, 520) is diffracted by the second grating 512. Each incidence of diffraction will result in multiple +/− first diffraction order radiation 522 and, to a much lesser extent (as described previously), and potentially even negligible, zeroth order radiation 524.

As can be seen from the Figure, if two identical gratings are combined (i.e., one grating 512 being located downstream of the other 510) first order radiation 518, 520 diffracted from the first grating 510 will be transformed back into the direction of zeroth order (or in other words, the same direction as reflected radiation) of the second grating 512. In this way, the second grating 512 cancels half of the attenuation affect of the first grating 510, leading to a suppression of only 50%. This is shown in FIG. 12 by grouping 526, which encompasses reflected radiation of the first wavelength 516 (e.g. EUV radiation) but also, travelling in a parallel direction, first diffraction order radiation 522 diffracted from the second grating 512 (that was, itself, comprised of first order diffracted radiation from the first grating 510). Since this grouping 526 is parallel, there is a good chance that the grouping will propagate toward and/or through downstream apparatus, where the undesirable radiation could cause damage or distortion. Ideally, then, it is desirable to avoid this situation (i.e. as described in FIG. 12).

The abovementioned issues may be obviated or mitigated by providing a filter that comprises a first diffraction grating 510 and a second diffraction grating 512 located downstream of the first diffraction grating. Each grating is configured to, in use, substantially reflect incident radiation of a first wavelength (e.g., EUV radiation), and to substantially diffract radiation of a second, longer wavelength (e.g., undesired radiation, such as DUV or infrared radiation). In order to ensure that the abovementioned issues are obviated or mitigated, the first grating has a slightly different periodicity to the second grating. The difference in periodicity is such that, in use, radiation of the second wavelength that is diffracted into a first diffraction order by the first diffraction grating, and subsequently diffracted into a first diffraction order by the second diffraction grating, is directed from the second diffraction grating in a different direction to radiation of the first wavelength that is reflected off both the first diffraction grating and, subsequently, the second diffraction grating. In other words, radiation reflected by the second grating does not propagate in the same direction as radiation diffracted by the second grating in to the first diffraction order (i.e. the undesired radiation such as IR or DUV radiation has a different direction than the desired EUV radiation). The difference in the periodicity need only be slightly different, thus ensuring that the reflection and suppression functionality of each grating is maintained, but that the reflection and suppression of combined gratings does not result in the issues shown in and described with reference to FIG. 12 (i.e. in order to avoid the propagation of the undesired radiation toward and/or through downstream apparatus, where the undesirable radiation could cause damage or distortion). Only a slight angular separation between reflected radiation and first order diffracted radiation may be desired to solve the abovementioned issues, meaning that only a small difference in periodicity may be needed. Functionally, the angle need only be such that the undesired radiation is not directed in or on to components that could be damaged (e.g. in an illuminator or projection system of a lithographic apparatus).

As described previously, the formation or initiation of a radiation generating plasma may not necessarily be undertaken using only a single laser beam. For example, in some embodiments, a desirable alternative may involve the use of two laser beams; a first beam of radiation directed, in use, onto a fuel target to form a modified target; and a second beam of radiation directed onto the modified target so as to form a radiation-generating plasma from the modified target. The first and second laser beams may be produced by the same or different laser(s). The first beam of radiation (commonly referred to as a pre-pulse/beam) may be used to improve the conversion efficiency of or for the second, and subsequent, second beam (commonly referred to as a main pulse/beam). For instance, the pre-pulse may be a relatively low power pulse that is used to heat and/or otherwise expand the target to form a modified target, which may allow the second (usually more powerful) main pulse to convert the modified target into a plasma with greater efficiency, allowing the target to be used to generate radiation in a more efficient manner. In an embodiment, a plurality of pre-pulse beams acting from different directions may be used simultaneously to form a modified target. In another embodiment, a plurality of main pulse beams may be used simultaneously from different directions to increase conversion efficiency even further. In yet another embodiment, one of the different directions of the pre-pulse and/or of the main pulse beam(s) is the direction of the optical axis. Irradiation of the target with one or more pre-pulse beam(s) and one or more main pulse beam(s) may be applied to any shaped targets as described below.

Figure 13:
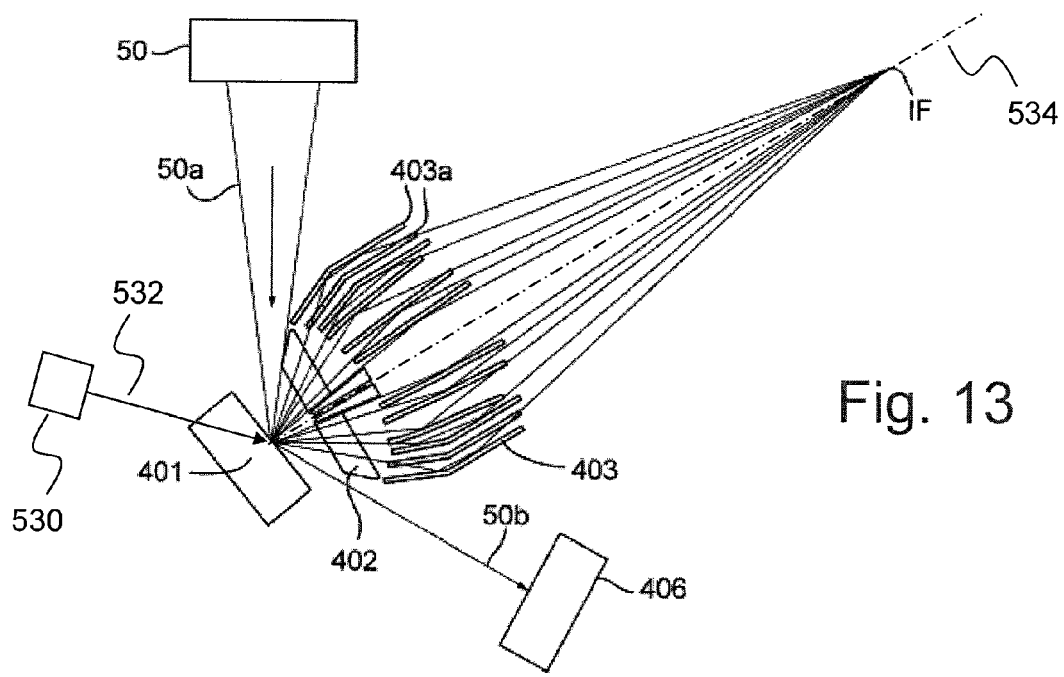
FIGS. 13 and 14 schematically depict the use of a pre-pulse radiation beam in conjunction with the radiation sources already shown in and described with reference to FIGS. 3 and 4, respectively.
Figure 14:
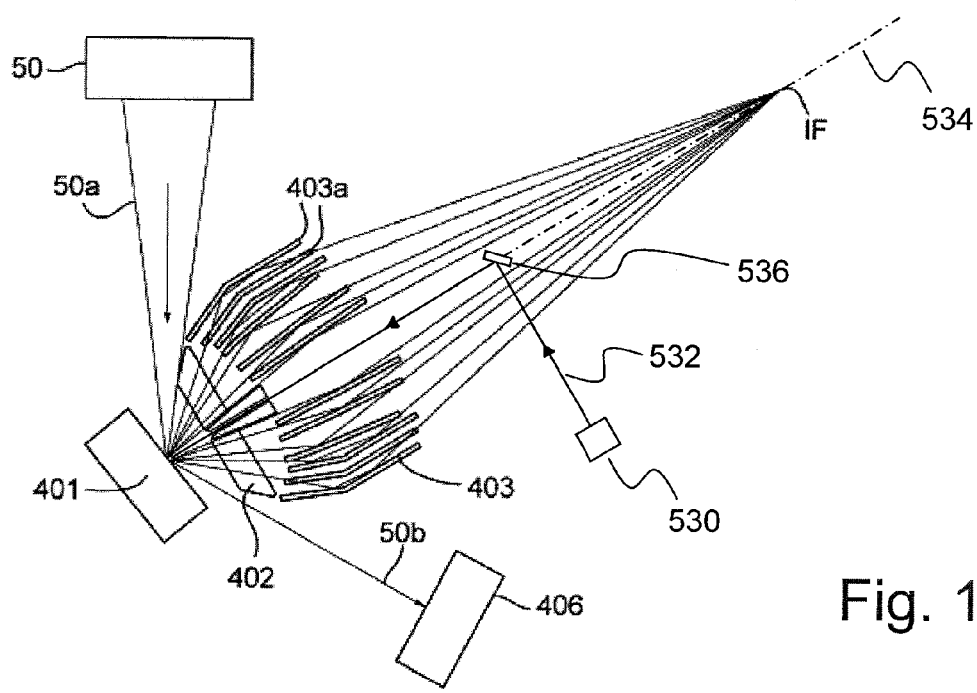

Thus, according to an embodiment of the present invention, there is provided a source-collector device constructed and arranged to generate a radiation beam. The device comprises a target unit constructed and arranged to present a target of plasma forming material (e.g., a surface, a stream, a sheet, a droplet, or the like). A first laser configuration is arranged to generate a first beam of radiation (which includes a pulse of such radiation), directed, in use, onto the target to form a modified target. A second laser configuration is arranged to generate a second beam of radiation (which includes a pulse of such radiation), directed, in use, onto the modified target so as to form a (radiation generating) plasma from said plasma-forming material. The first and second laser configurations may be different laser units or the like, or substantially the same unit but in different configurations. A radiation collector is also provided and comprises one or more grazing incidence reflectors arranged to collect radiation emitted by the plasma and to form a beam therefrom. FIGS. 13 and 14 will be used to describe embodiments of the invention.

FIG. 13 schematically depicts substantially the same embodiment as shown in and described with reference to FIG. 4. A difference is that a pre-pulse (i.e. first) laser configuration 530 is now provided in order to provide a pre-pulse of laser radiation 532 onto the target 401, and to modify that target 401, prior to the subsequent directing onto the (modified by the pre-pulse radiation 532) target 401 of the main plasma generating laser beam 50a by the excitation (i.e. second) laser 50.

Depending on the requirements of the apparatus as a whole, for example in terms of functionality, constructional restraints, or the like, the incident direction of the pre-pulse 532 and main beam 50a may be chosen accordingly, in particular relative to an optical axis 534 of the grazing incidence radiation collector 403. Examples of different choices and associated advantages (and in some cases, potential disadvantages) will now be discussed.

In one example, the pre-pulse radiation and/or main beam radiation may pass through one or more of the reflectors 403a of the grazing incidence radiation collector 403 and/or the contamination trap 402 (or, more generally, a debris mitigation arrangement) before being incident on the target/modified target 401. This may result in a more compact arrangement as a whole, among other possible advantages. In one specific embodiment, the contamination trap (which may be rotatable or stationary in form) may have a hollow axis along and through which one or both of the pre-pulse radiation and main beam radiation may pass before being incident on the target. This may allow for an even more compact design. One or both of the pre-pulse radiation and main beam radiation may also pass along a longitudinal axis of the radiation collector, which will typically be the optical axis of the collector 534.

One or both of the pre-pulse radiation and main beam radiation may be directed along the optical axis of the collector, either in the same direction (both beams irradiating either the back side of the target (being a substantially flat surface) facing the radiation collector or the opposite, front side of the target located away relative to the radiation collector), or in opposite directions (one beam coming from the front side and the other from the back side of the target relative to the radiation collector, along the optical axis of the collector). More generally, the pre-pulse and the main beam radiation may have components along the optical axis of the collector which are in the same or opposite directions. Again, the exact choice may depend on the exact setup of the radiation source as a whole, the available space, the desired distribution of radiation and contamination resulting from the creation of the plasma, and the like. For example, in an embodiment (not shown herein) the principles shown in FIGS. 13 and 14 may be combined. For example, in an embodiment, the pre-pulse radiation may have a directional component that is along the optical axis and toward the collector (as shown in FIG. 13), whereas the main radiation pulse may come from substantially the opposite direction. For example, the main radiation pulse may be directed along the optical axis and/or through the collector and/or contaminant trap, in much the same manner as the described in relation to the directing of the pre-pulse of FIG. 14.

As shown in FIG. 13, the main beam of laser beam radiation is directed toward the modified target substantially at an angle of >0° and <90° with respect to the optical axis 534 of the grazing incidence radiation collector 403. This results in the main beam of radiation having an angle of incidence that promotes reflection of any radiation not used in the conversion of the target into a plasma toward the described beam dump 406 or the like. This may be more difficult to achieve if the main beam of radiation was directed along the optical axis 534 or perpendicular to the optical axis 534. Also, if the laser radiation was directed along the optical axis 534 or perpendicular to the optical axis 534, there is greater chance that any radiation not used to generate the plasma could be directed back toward the laser, which may cause damage to the laser, or unintentional triggering thereof. Of course, in other embodiments it may be appropriate to ensure that the main beam of laser radiation is perpendicular to the optical axis, or directed along that optical axis, again for reasons of design convenience.

When a plasma is generated, the distribution of any particulate contamination generated in the formation of the plasma, and also any emission of radiation from the plasma, is not necessarily, or in practice likely to be, isotropic. Instead, it is possible that the contamination will preferentially backscatter in the general direction from which the main beam originated, and it is also possible that the radiation emitted by the plasma will have similar distribution. Thus, in some instances it may be desirable for the first and/or second beam of radiation to be directed toward a side of the target that faces away from the collector 403 (i.e. the front side of the target) to reduce the amount of contamination that is directed toward that collector. However, this is likely to also result in less radiation being directed towards and collected by the collector 403. Thus, in other embodiments, the first and/or second beam of radiation may be directed toward a side of the target that faces toward the collector 403 (i.e. the back side of the target), as shown in FIG. 13. This should result in more radiation being directed towards and collected by the collector 403, but at the same time may result in more contamination also being directed towards the collector 403. This is one reason for locating the contamination trap 402 (or, in general, a debris mitigation arrangement) in-between the target (and thus the plasma formation location) and the collector.

When a pre-pulse beam of radiation is used, the angle of incidence of the pre-pulse beam on the target may, in some instances, be arbitrary. However, the direction can be chosen to at least attempt to optimize the amount of radiation that is subsequently generated by the plasma and collected by the collector, or for other reasons. For instance, it has been found that the target will expand in a direction generally substantially perpendicularly to the angle of incidence of the pre-pulse radiation. This elongation, which may be described or be interpreted as a flattening, or widening, may be useful in reflecting any portions of a subsequently directed main beam that are not used in the conversion of the target to a plasma, for example reflecting that portion to a beam dump or the like, as shown in FIG. 13. Alternatively and/or additionally, the elongation of the target into a modified target may also be used in the optimization of the generation and collection of radiation. For instance, it has been found that when the elongated modified fuel target is targeted by the main beam of radiation, the radiation that is emitted by the subsequently created plasma will be emitted generally in a direction that is substantially perpendicular to the direction of elongation of the target—i.e., in the same direction from which the pre-pulse radiation was incident. FIG. 14 shows how this principle can be taken advantage of.

FIG. 14 is a modification of the arrangement already shown in and described with reference to FIGS. 4 and 13. However, in FIG. 14 the pre-pulse radiation beam 532 is directed along the optical axis 534 of the collector 403, for example by one or more appropriately located re-directing elements 536 (e.g., a mirror or the like, or some other element with reflective capability and/or focusing capability). This arrangement ensures that the pre-pulse will create a modified fuel target that is elongated substantially transverse to the optical axis 534 of the collector 403 which will, after the targeting of the modified target 301 by the main beam 50a, result in the preferential distribution of generated EUV radiation towards the collector 403. Due to the orientation of the elongated modified target 301, and the direction of the main beam 50a, this may ensure that radiation that is generated by the plasma will be preferentially emitted in the direction of, and thus collected by, the collector 403. In another advantageous embodiment it has been found that directing the main pulse beam 50a on the direction of the optical axis of the collector towards the back side of the target which is closer to the collector 403 (such as shown in FIG. 14 for the pre-pulse beam 532) may result in a substantial increase of conversion efficiency. The pre-pulse beam 532 may be in this embodiment directed under an angle towards to front of back side of the target. However, for an improved conversion efficiency preferably the pre-pulse beam is directed (or re-directed by re-directing device such as device 536 in FIG. 14, located now at the other side of the target) to provide a pre-pulse beam on the optical axis irradiating the front side of the target, in a direction opposite to the main pulse beam 50a.

Figure 15:
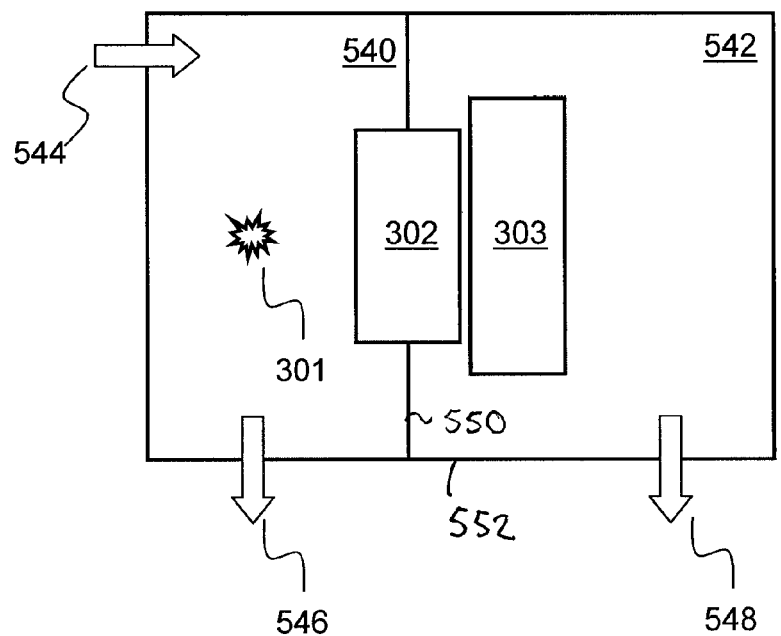
FIGS. 15 and 16 schematically depict a source-collector device having two chambers at different pressures, in accordance with an embodiment of the present invention.

In the radiation sources and source-collector device arrangements as discussed above, it may be convenient to provide a gaseous environment in one or more regions of the arrangement, for example to act as a buffer gas for particulate contamination generated in the generation of the plasma, whereas in other parts of the arrangement it may be desirable (or at least convenient) to provide a low pressure environment to, for example, minimize the absorption of radiation that is generated by the plasma. FIG. 15 shows a source-collector device according to an embodiment of the present invention, which could be used in conjunction with any of the embodiments described herein. The source-collector device comprises a first chamber 540 and a second chamber 542. Gas present in the source-collector device is, in use, allowed to pass from one of the first chamber 540 and second chamber 542 to the other of the first chamber 540 and second chamber 542. The first chamber 540 houses a plasma formation location, which is the location at which a radiation generating plasma is formed, and equates to the location of the target 301 (or 401), as discussed above. The second chamber 542 houses the radiation collector 303 (or 403), also discussed above), which is arranged to collect radiation generated, in use, at the plasma formation location 301 and to form a beam therefrom. The source-collector device further comprises a contaminant trap (e.g., a stationary and/or rotational foil trap) constructed and arranged to reduce propagation of particulate contaminants generated at the plasma formation location to the grating incidence radiation collector 303. The contaminant trap 302 (or 402) is located in-between the plasma formation location 301 and the radiation collector 303.

The use of two distinct chambers allows the first chamber 540 to be, in use, at a first gas pressure (i.e. gas within the first chamber 540 to be at a first gas pressure) and the second chamber 542 to be, in use, at a second, different gas pressure (i.e. gas within the second chamber 542 to be at a second gas pressure). This may be particularly advantageous. For instance, a higher gas pressure may be used in the first chamber 540, where it is desired to use the gas in that chamber 540 as a buffer gas, and/or to reduce the temperature of components in the chamber 540, or of the chamber 540 itself. The gas may, for example, reduce the energy of ions or other contamination generated in the formation of the plasma, (which could otherwise cause damage to parts of the device) and/or reduce the chances of these contaminants passing into the second chamber 542, where the sensitive collector 303 could otherwise become coated, damaged and/or degraded as a result. The gas may also prevent or at least inhibit contamination from passing onto and through the chamber 542 (e.g. through an aperture therein, not shown) and onto and into parts of the lithographic apparatus connected to the source-collector. The increased amount of gas in the first chamber 540 may alternatively or additionally be used to cool one or more components within that chamber 540, which components may become hot due to their proximity to the plasma and due to high energy contaminants coming into contact with components after generation of the plasma. The gas may be, for example, argon, hydrogen, nitrogen, etc The first chamber 540 has a gas inlet 544 for introducing gas into the first chamber 540, and a gas outlet 546 for removing gas directly from the first chamber. Such an arrangement allows gas to be directly introduced and removed from the first chamber (i.e., not necessarily via the second chamber 542). This may allow for a high flow rate of gas into and through the first chamber 540, and/or the ability to more readily establish a high pressure gaseous environment in the first chamber 540. A typical flow of gas through the first chamber 540 suitable for slowing or stopping particulate contamination may be of the order of 7.5 slm. However, additional gas may be used to cool the first chamber 540 or components contained therein, and the arrangement described previously with a dedicated inlet 544 and outlet 546 for the first chamber 540 may facilitate this additional gas flow. The gas flow in total according to an embodiment of the present invention may thus be in the range of 15 slm to 200 slm, 30 slm to 180 slm, 60 slm to 150 slm, 80 slm to 120 slm, or substantially 100 slm. The higher the gas flow, the more suitable is to slow down or stop the particulate contamination. The gas pressure in the first chamber 540 may be in the range of 20-30 Pa. The pressure in the second chamber 542 may not need to be so high, since most particulate contamination buffering and/or cooling will be undertaken in the first chamber 540 For example, the pressure may be in the region of 0.5-1 Pa. The lower pressure may also reduce absorption of radiation that is generated by the plasma and collected and focused by the collector 303.

The second chamber 542 may also have a gas outlet 548. The gas outlet 548 may comprise or be in connection with a turbo pump, which turbo pump may be used to maintain the low pressure within the second chamber 542. In contrast, the outlet 546 of the first chamber 540 may comprise or be in connection with a pre-pump, since the pressure within the first chamber 540 is far higher and may not require the use of a turbo pump.

At this point, it may be thought that increasing the flow rate of gas through the first chamber 540 may be readily achieved by using additional further turbo pumps in connection with one or more outlets of the second chamber 542. However, this is often not practical due to the costs and space requirements involved. The solution provided above is far simpler, and potentially lower in cost.

As can be seen in FIG. 15, the first chamber 540 and second chamber 542 may be at least partially defined by a division 550 in a housing 552, or abutted walls of adjacent housings (not shown in this embodiment). The contaminant trap 302 may form part of the division 550, or be in connection therewith. In order to limit the amount of contamination that may pass from the first chamber 540 to the second chamber 542, the contaminant trap 302 may be constructed and arranged to allow gas to pass from the first chamber 540 to the second chamber 542. Indeed, a source-collector device as a whole may be arranged such that gas may only pass between the chambers 540, 542 via the contaminant trap 302. This may also serve as a restriction to gas flow, and may thus assist in maintaining a relatively high pressure in the first chamber 540.

Figure 16:
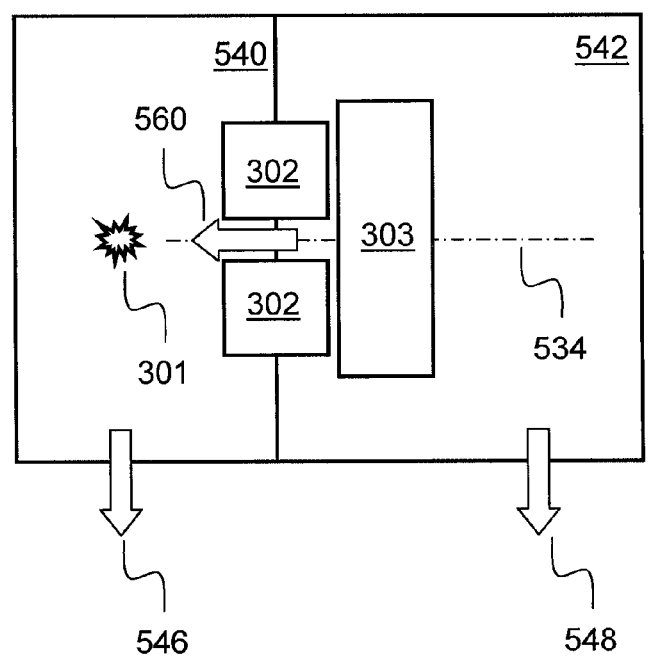

FIG. 16 shows a modified version of the embodiment shown in FIG. 15. In FIG. 16, a gas inlet 560 to the first chamber 540 is provided along the optical axis 534 of the collector 303, such that the resulting gas flow is directed directly towards the plasma formation location 301, which is likely to be the hottest part of the first chamber 540, and the origin of particulate contamination that the gas is used to buffer and/or reduce the thermal energy of. The gas inlet 560 may conveniently extend through a hollow axis or the like of the contaminant trap 302 and/or collector 303, which axis will usually coincide generally with the plasma formation location 301 (i.e. the plasma formation location point is intersected by the axis).

In the above embodiments, a laser produced plasma radiation source/source-collector has been described. However, many of the principles discussed in relation to those embodiments may be applied to discharge produced plasma radiation sources. For instance, many of the issues identified above, and solved in accordance with the embodiments described herein thus far, may also solve issues associated with discharge produced radiation sources (different or related issues). For instance, in laser produced plasma radiation sources where a droplet is targeted by a laser to generate a radiation-generating plasma, it can be difficult to reliably, and accurately, target the droplets for formation of the radiation-generating plasma. The use of a container of plasma-forming material (e.g., a bath or a dish or the like), into which, or onto a surface of which, one or more beams of radiation is or are directed may avoid the issues associated with the use of droplets. The use of a container of plasma-forming material may also solve issues with existing discharge produced plasma radiation sources, as will now be described.

Referring now to a discharge produced plasma radiation source, it is common to rotate a wheel at least partially immersed in a container of plasma-forming material to coat a rim thereof with that material. An electrical discharge is the provided between a body and material carried by the rim of the wheel in order to generate a radiation generating plasma. However, in such a discharge produced plasma radiation source, it is difficult to maintain on the rim of the wheel a desirable (e.g., constant and/or consistent) layer of material of a particular thickness. In contrast, and in accordance with an embodiment of the present invention, providing a discharge between a body (e.g. an electrode) and a volume of plasma-forming material in a container may solve these issues. An embodiment will now be discussed in relation to FIG. 17.

Figure 17:
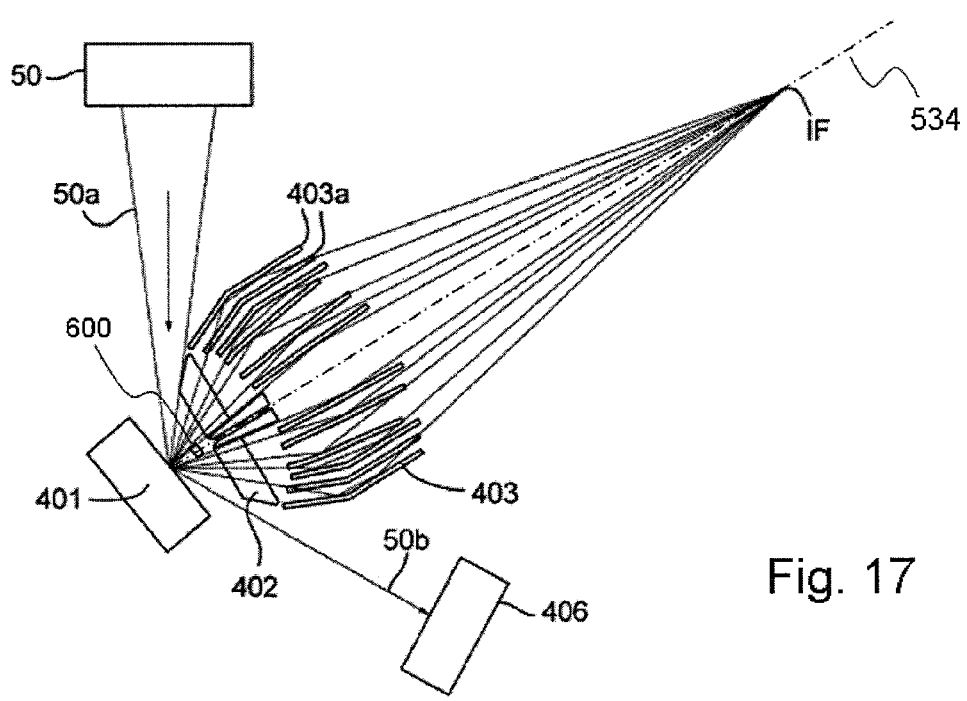
FIG. 17 schematically depicts a discharge produced plasma radiation source and collector, in accordance with an embodiment of the invention.

FIG. 17 schematically depicts a discharge produced plasma radiation source and collector in accordance with an embodiment of the present invention. The layout of the source (or source-collector device, when the collector is part of the layout) is much the same as that already shown in and described with reference to FIGS. 3 and/or 4. FIG. 17 is based, in this particular example, on the embodiment shown in and described with reference to FIG. 4, but could equally be applied to the embodiment shown in and described with reference to FIG. 3, or another variant thereon.

In contrast to the embodiment shown in FIG. 4, in the embodiment shown in FIG. 17, an electrode 600 is provided that is located adjacent to the target 401 which, in this case, is a container arranged to contain a volume of plasma-forming material. As is the case in conventional discharge produced plasma radiation sources (which will not be discussed in detail here), the electrode 600 is arranged, in use, to facilitate an electrical discharge between the electrode 600 and the plasma-forming material contained in the container 401 in order to generate a radiation generating plasma therefrom. The electrode 600 could be located in an obscuration of the radiation collector 403 (or another obscuration) so that the electrode does not reduce the amount of radiation that is collected by the collector and/or used to form a beam therefrom.

The use of a container 401 of plasma-forming material, as opposed to, for example, a layer of material provided on a rotating wheel at least partially immersed in such a container, may be advantageous. This is because there is no need to consider and maintain constant and consistent layer thicknesses, which is the case in the wheel-based approach. So long as plasma-forming material is within the container (with practical limits associated with distance from the electrode and the like, which limits are far easier to accommodate than constant and consistent layer thicknesses on a rotating wheel), a discharge may be used to generate a radiation generating plasma.

It may be possible to produce an electrical discharge directly between the electrode 600 and a (target) surface of the volume of plasma-forming material contained in the container 401. However, in practice, a plasma may be more readily formed if a more conductive path is selectively provided between the electrode 600 and the surface of the plasma-forming material. FIG. 17 shows how this may be undertaken. Referring back to the embodiment of FIG. 4, the excitation laser 50 (or, more generally, the laser unit 50) is described as being arranged to provide a laser beam 50*a* that is to be directed to the target 401 for use in directly generating a radiation-generating plasma from plasma-forming material constituting the target 401. In general terms, much the same arrangement can be used in conjunction with the arrangement of FIG. 17 to provide the desired conductive, or more conductive, path between the volume of plasma-forming material in the container 401 and the electrode 600. Referring to FIG. 17, the laser beam 50a is now sufficient (e.g. in terms of directions, power, or the like) to form a cloud of plasma-forming material (which may be a vapor or the like) substantially in-between the electrode 600 and a target surface of the plasma-forming material contained in the container 401. This cloud forms the conductive, or more conductive, path, and may thus be described as facilitating the production of the discharge.

It is possible that, in one example, the discharge between the electrode 600 and the plasma-forming material contained in the container 401 will be triggered by the formation of the cloud of plasma-forming material, since this formation will provide a conductive (or more conductive) path through which the discharge (or in other words, breakdown) may take place. This is particularly the case if there is a constant potential different between the electrode 600 and the volume of plasma forming material. However, in other embodiments the discharge may not necessarily be triggered by the formation of a cloud of plasma-forming material. For instance, the discharge may be selectively initiated, for example by some form of driver, to coincide with the timing of the formation of the cloud if, indeed, such cloud formation is necessary.

However the discharge is generated, a voltage source will likely be connected to the electrode and/or the volume of plasma-forming material and arranged, in use, to establish a potential difference between the electrode and the volume of plasma-forming material, to establish conditions for subsequent electrical discharge. The voltage source may be a constant voltage source, particularly when the formation of the cloud is used to trigger the discharge. Alternatively and/or additionally, the voltage source may be a voltage source which is in some way pulsed or the like, the voltage source only establishing a desired potential difference when a discharge is desired.

In FIG. 17, the container of fluid is shown in a non-horizontal manner. This may be convenient or desired if, for example, the radiation source as a whole needs to be angled in some way. This may be necessary due to constructional restraints of the radiation source, or apparatus use in conjunction therewith (e.g. a lithographic apparatus). However, in such an orientation, the target surface will be horizontal, under the influence of gravity. It may be desirable to ensure that the target surface of the volume of plasma-forming material is substantially perpendicular with respect to the optical axis 534 of the radiation collector 403, which, in FIG. 17, equates to the target surface being non-horizontal. An orientation that is perpendicular with respect to the optical axis 534 may ensure that radiation that is generated by the radiation-generating plasma is generated substantially in the direction of the optical axis 534 of the radiation collector 403, optimizing collection. The material within the container 401 may be contained at a substantially perpendicular orientation with respect to the optical axis 534, for example by providing one or more surfaces in the container along or over which a volume of fluid may fall, may pass, or may be driven—for example, using the impellers or other arrangements described above, or some other arrangement (e.g., pumps or the like). Of course, in another example, the optical axis 534 may be substantially vertical, making it easier to maintain the target surface in a horizontal orientation—i.e. this will be the natural surface orientation that the volume would adopt in a container, under the influence of gravity.

The target surface may be any part of the surface of the volume of plasma-forming material. The target surface may be, for example, a region in, around or at least comprising the location at which the laser beam 50a was incident.

In the above embodiment, a cloud has been exemplified with reference to a vapor. However, a cloud may be functionally described as any form of plasma-forming material which facilitates discharge between the electrode and the volume of plasma-forming material. For example, the cloud could be an array of droplets, a plurality of streams, a splash or backsplash of material.

It will be appreciated that one or more of the principles and associated implementing apparatus described in other embodiments herein (in particular, those describing containers, e.g. baths or dishes) may also be used in conjunction with this aspect of the invention. For example, a current or the like may be induced in the volume of plasma-forming material, to ensure that material at the surface is circulated and/or replenished.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below, and without departing from the following numbered clauses:

1. A source-collector device constructed and arranged to generate a radiation beam, the device comprising:
    a target unit constructed and arranged to present a target surface of plasma-forming material;
    a laser unit constructed and arranged to generate a beam of radiation directed onto the target surface so as to form a plasma from said plasma-forming material;
    a contaminant trap constructed and arranged to reduce propagation of particulate contaminants generated by the plasma;
    a radiation collector comprising a plurality of grazing-incidence reflectors arranged to collect radiation emitted by the plasma and form a beam therefrom; and
    a filter constructed and arranged to attenuate at least one wavelength range of the beam.

2. A device according to clause 1, wherein the target surface has a minimum dimension greater than or equal to 10 μm.

3. A device according to clause 2, wherein the target surface has a minimum dimension greater than 40 μm.

4. A device according to clause 3, wherein the target surface has a minimum dimension in the range of from about 90 μm to about 100 μm.

5. A device according to any one of clauses 1-4, wherein the target unit comprises a bath constructed and arranged to contain a liquid metal as the plasma-forming material.

6. A device according to clause 5, wherein the target unit comprises a wheel constructed an arranged to be partially immersed in said liquid metal.

7. A device according to clause 6, wherein the wheel has a plurality of teeth.

8. A device according to clause 6 or 7, wherein the wheel has at least one cavity arranged to confine the plasma-forming material when irradiated by the laser unit.

9. A device according to clause 5, wherein the target unit further comprises an impeller constructed and arranged to create a current in the liquid material contained in the bath.

10. A device according to any one of clauses 1-4, wherein the target unit comprises a dish constructed and arranged to contain a liquid material as the plasma-forming material and a motor constructed and arranged to rotate the dish.

11. A device according to any one of the preceding clauses wherein the target unit is located within a resonant cavity of the laser unit.

12. A device according to any one of the preceding clauses wherein the contaminant trap comprises a rotating foil trap.

13. A device according to any one of the preceding clauses wherein the contaminant trap comprises a gas barrier.

14. A device according to any one of the preceding clauses, wherein the filter comprises a grazing-incidence reflector having a diffraction grating formed thereon.

15. A device according to any one of clauses 1 to 13, wherein the filter comprises a diffraction grating formed on the grazing incidence reflectors of the radiation collector.

16. A device according to any one of clauses 1 to 13, wherein the filter comprises a first diffraction grating and a second diffraction grating located downstream of the first diffraction grating, each grating being configured to, in use, substantially reflect incident radiation of a first wavelength, and to substantially diffract radiation of a second, longer wavelength, the first diffraction grating having a different periodicity to the second diffraction grating.

17. A device according to clause 16, wherein the difference in periodicity is such that, in use, radiation of the second wavelength that is diffracted into a first diffraction order by the first diffraction grating, and subsequently diffracted into a first diffraction order by the second diffraction grating, is directed from the second diffraction grating in a different direction to radiation of the first wavelength that is reflected off both the first diffraction grating and, subsequently, the second diffraction grating.

18. The device according to clause 16 or clause 17, wherein the first grating and/or the second grating forms part of one or more of: the grazing incidence reflector; and the radiation collector.

19. The device according to any preceding clause, further comprising:
    a first chamber and a second chamber, wherein gas, in use, is allowed to pass from one of the first chamber and second chamber to the other of the first chamber and second chamber;
    the first chamber housing, in use, a location of a target;
    the second chamber housing the radiation collector;
    the contaminant trap being located in-between the target location and the grazing incidence radiation collector;
    the first chamber being arranged, in use, to contain gas at a first pressure, and the second chamber being arranged, in use, to contain gas at a second pressure.

20. A device according to any one of clauses 1-4, wherein the target unit comprises a liquid supply in the form of a liquid injector configured to inject drops of a liquid as the plasma-forming material.

21. A lithographic apparatus, comprising:
    a source-collector device according to anyone of the preceding clauses;
    a support configured to support a patterning device, the patterning device being configured to impart the beam of radiation with a pattern in its cross-section;
    a substrate table configured to hold a substrate; and
    a projection system configured to project the patterned beam onto a target portion of the substrate.

22. A device manufacturing method, comprising:
    directing a laser beam onto a target surface of a plasma-forming material to form a plasma;
    trapping particulate contaminants emitted by the plasma;
    collecting radiation emitted by the plasma and forming the radiation into a beam;
    filtering the beam to attenuate at least one range of wavelengths;
    patterning the beam of radiation with a pattern in its cross-section; and
    projecting the patterned beam of radiation onto a target portion of a substrate.

23. A lithographic apparatus, comprising:
    a source-collector device constructed and arranged to generate a radiation beam, the device comprising
        a target unit constructed and arranged to present a target surface of plasma-forming material;
        a laser unit constructed and arranged to generate a beam of radiation directed onto the target surface so as to form a plasma from said plasma-forming material;
        a contaminant trap constructed and arranged to reduce propagation of particulate contaminants generated by the plasma;
        a radiation collector comprising a plurality of grazing-incidence reflectors arranged to collect radiation emitted by the plasma and form a beam therefrom; and
        a filter constructed and arranged to attenuate at least one wavelength range of the beam;
    a support configured to support a patterning device, the patterning device being configured to impart the beam of radiation with a pattern in its cross-section;
    a substrate table configured to hold a substrate; and
    a projection system configured to project the patterned beam onto a target portion of the substrate.

24. A radiation collector comprising a plurality of grazing-incidence reflectors arranged to collect radiation emitted by a plasma and form a beam therefrom; and a filter constructed and arranged to attenuate at least one wavelength range of the beam, the filter comprising a diffraction grating formed on the grazing incidence reflectors of the collector with grooves oriented parallel to an optical axis of the radiation collector.

25. A radiation source comprising:

a bath constructed and arranged to contain a fuel for use as a plasma-forming material; and a wheel constructed an arranged to be at least partially immersed in, and rotatable within, said fuel, such that a rim of the wheel may be immersed, in use, in the fuel;

wherein a surface of the rim is curved across a width of the rim.

26. A radiation source according to clause 25, wherein the surface of the rim is curved outwardly away from a center of the wheel.

27. A source-collector device constructed and arranged to generate a radiation beam, comprising:

a first chamber and a second chamber, wherein gas, in use, is allowed to pass from one of the first chamber and second chamber to the other of the first chamber and second chamber;

the first chamber housing a plasma formation location;

the second chamber housing a grazing incidence radiation collector arranged to collect radiation generated, in use, at the plasma formation location, and to form a beam therefrom;

the source-collector device further comprising a contaminant trap constructed and arranged to reduce propagation of particulate contaminants generated at the plasma formation location to the grazing incidence radiation collector, the contaminant trap being located in-between the plasma formation location and the grazing incidence radiation collector;

the first chamber being arranged, in use, to contain gas at a first pressure, and the second chamber being arranged, in use, to contain gas at a second pressure.

28. A device according to clause 27, wherein the first pressure is higher than the second pressure.

29. A device according to clause 27 or clause 28, wherein the first chamber comprises a gas inlet for introducing gas into the first chamber, and a gas outlet for removing gas from the first chamber.

30. A device according to clause 29, wherein the inlet is arranged to direct gas substantially along an optical axis of the collector, and/or toward the plasma formation location.

31. A device according to any of clauses 27 to 30, wherein the second chamber comprises a gas outlet.

32. A device according to any of clauses 27 to 31, wherein the contaminant trap is constructed and arranged to allow gas to pass from one of the first chamber and second chamber to the other of the first chamber and second chamber.

33. A device according to any of clauses 27 to 32, wherein the device is configured such that the gas may only pass between the first and second chambers via the contaminant trap.

34. A device according to any of clauses 27 to 33, wherein the first chamber and second chamber are at least partially defined by a division in a housing, and the contaminant trap provides an aperture in the division.

35. A device according to any of clauses 27 to 33, wherein the first chamber and second chamber are at least partially defined by separate housings, and the contaminant trap provides a conduit between the separate housings, through which radiation and/or gas may pass.

36. A source-collector device constructed and arranged to generate a radiation beam, the device comprising:

a target unit constructed and arranged to present a target of a plasma-forming material;

a first laser configuration arranged to generate a first beam of radiation directed, in use, onto the target to form a modified target;

a second laser configuration arranged to generate a second beam of radiation directed, in use, onto the modified target so as to form a radiation generating plasma from said plasma-forming material; and a radiation collector comprising one or more grazing-incidence reflectors, and arranged to collect radiation emitted by the plasma and to form a beam therefrom.

37. A device according to clause 36, wherein the first beam of radiation and/or the second beam of radiation is directed, in use, substantially along an optical axis of the radiation collector and onto the target or modified target.

38. A device according to clause 37, wherein the first beam of radiation and the second beam of radiation are directed, in use, substantially along the optical axis of the radiation collector, and in substantially the same direction along that optical axis.

39. A device according to clause 37, wherein the first beam of radiation and the second beam of radiation are directed, in use, substantially along the optical axis of the radiation collector, and in substantially opposite directions along that optical axis.

40. A device according to clause 36 or clause 37, wherein the first beam of radiation and the second beam of radiation have directional components, in use, along the optical axis of the radiation collector that are opposite to one another.

41. A device according to clause 36 or clause 37, wherein the second beam of radiation is directed, in use, toward the modified target substantially at an angle of greater than 0 degrees and less than 90 degrees with respect to the optical axis of the radiation collector.

42. A device according to any of clauses 36 to 41, wherein the first beam of radiation and the second beam of radiation is directed, in use, toward a side of the target or modified target that faces away from the radiation collector.

43. A device according to any of clauses 36 to 41, wherein the first beam of radiation and/or the second beam of radiation is directed, in use, toward a side of the target or modified target that faces toward the radiation collector.

44. A device according to any of clauses 36 to 43, wherein a debris mitigation arrangement is located in-between a location of the target and the radiation collector.

45. A device according to any of clauses 36 to 44, wherein the first beam of radiation and/or the second radiation beam is, in use, directed to pass through the radiation collector and/or the or a debris mitigation arrangement, and onto the target or modified target.

46. A device according to clause 44 or clause 45, wherein the debris mitigation arrangement is a stationary or rotatable contamination trap, and wherein the first beam of radiation, and/or the second beam of radiation, is directed, in use, along and through a hollow axis of the contamination trap, and onto the target or modified target.

47. A device according to any of clauses 36 to 46, wherein the first beam of radiation is configured to elongate the modified fuel target in a direction substantially perpendicular with respect to the optical axis of the radiation collector.

48. A device according to any of clauses 36 to 47, wherein the device further comprises a filter constructed and arranged to attenuate at least one wavelength range of the beam.

49. A lithographic apparatus comprising the radiation collector, the radiation source, and/or the source collector device of any of clauses 22 to 47.

50. A radiation source comprising:
a container arranged, in use, to contain a volume of plasma-forming material, a surface of that volume defining a target of plasma-forming material; and
an electrode located adjacent the container, and arranged in use to facilitate an electrical discharge between the electrode and the target to generate a radiation generating plasma.

51. A radiation source according to clause 50, further comprising a laser unit constructed and arranged to generate a beam of radiation directed, in use, onto the target so as to form a cloud of plasma-forming material substantially in-between the target and the electrode.

52. A radiation source according to clause 50 or clause 51, wherein the formation of the cloud is arranged to facilitate the production of the discharge.

53. A radiation source according to any of clauses 50 to 52, further comprising a voltage source connected to the electrode and/or the volume of plasma-forming material and arranged, in use, to establish a potential difference between the electrode and the volume of plasma-forming material.

54. A source-collector device constructed and arranged to generate a radiation beam, the device comprising:
the radiation source of any preceding clause; and
a radiation collector arranged to collect radiation emitted by the plasma and to form a beam therefrom.

55. A device according to clause 54, wherein the device further comprises one or more of:
a contaminant trap constructed and arranged to reduce propagation of particulate contaminants generated by the plasma; and
a filter constructed and arranged to attenuate at least one wavelength range of the beam.

56. A lithographic apparatus comprising the radiation source or source-collector device of any of clauses 50 to 55.

57. The lithographic apparatus of clause 56, wherein the lithographic apparatus comprises one or more of:
a support configured to support a patterning device, the patterning device being configured to impart the beam of radiation with a pattern in its cross-section;
a substrate table configured to hold a substrate; and
a projection system configured to project the patterned beam onto a target portion of the substrate.

58. A method of generating radiation, the method further comprising:
providing an electrical discharge between an electrode and a volume of plasma-forming material contained in a container, the discharge being sufficient to create a radiation generating plasma from the plasma-forming material.

59. A method according to clause 58, the method comprising directing a beam of radiation at the plasma-forming material to form a cloud of plasma-forming material substantially in-between the electrode and the volume of plasma-forming material.

60. A method according to clause 59, wherein the formation of the cloud triggers the discharge.

61. A method according to any of clauses 58 to 60, wherein the discharge is provided, at least in part, by providing a potential difference between the electrode and the volume of plasma-forming material that is sufficient to result in the discharge.

What is claimed is:
1. A source-collector device constructed and arranged to generate a radiation beam, the device comprising:
a target unit constructed and arranged to present a target surface of plasma-forming material;
a laser unit constructed and arranged to generate a beam of radiation directed onto the target surface so as to form a plasma from said plasma-forming material;
a contaminant trap constructed and arranged to reduce propagation of particulate contaminants generated by the plasma;
a radiation collector comprising a plurality of grazing-incidence reflectors arranged to collect radiation emitted by the plasma and form a beam therefrom; and
a filter constructed and arranged to attenuate at least one wavelength range of the beam,
wherein the target unit is located within a resonant cavity of the laser unit.

2. A source-collector device constructed and arranged to generate a radiation beam, the device comprising:
a target unit constructed and arranged to present a target surface of plasma-forming material;
a laser unit constructed and arranged to generate a beam of radiation directed onto the target surface so as to form a plasma from said plasma-forming material;
a contaminant trap constructed and arranged to reduce propagation of particulate contaminants generated by the plasma;
a radiation collector comprising a plurality of grazing-incidence reflectors arranged to collect radiation emitted by the plasma and form a beam therefrom; and
a filter constructed and arranged to attenuate at least one wavelength range of the beam wherein the filter comprises a grazing-incidence reflector having a diffraction grating formed thereon.

3. A source-collector device constructed and arranged to generate a radiation beam, the device comprising:
a target unit constructed and arranged to present a target surface of plasma-forming material;
a laser unit constructed and arranged to generate a beam of radiation directed onto the target surface so as to form a plasma from said plasma-forming material;
a contaminant trap constructed and arranged to reduce propagation of particulate contaminants generated by the plasma;
a radiation collector comprising a plurality of grazing-incidence reflectors arranged to collect radiation emitted by the plasma and form a beam therefrom; and
a filter constructed and arranged to attenuate at least one wavelength range of the beam wherein the filter comprises a diffraction grating formed on the grazing incidence reflectors of the radiation collector.

4. A device manufacturing method, comprising:
directing a laser beam onto a target surface having a plasma-forming material thereon to form a plasma;
trapping particulate contaminants emitted by the plasma;
collecting radiation emitted by the plasma and forming the radiation into a beam;
filtering the beam to attenuate at least one range of wavelengths;
patterning the beam of radiation with a pattern in its cross-section; and
projecting the patterned beam of radiation onto a target portion of a substrate.

5. A lithographic apparatus, comprising:
a source-collector device constructed and arranged to generate a radiation beam, the device comprising
a target unit constructed and arranged to present a target surface on which a plasma-forming material is present;
a laser unit constructed and arranged to generate a beam of radiation directed onto the target surface so as to form a plasma from said plasma-forming material;

a contaminant trap constructed and arranged to reduce propagation of particulate contaminants generated by the plasma;

a radiation collector comprising a plurality of grazing-incidence reflectors arranged to collect radiation emitted by the plasma and form a beam therefrom; and a filter constructed and arranged to attenuate at least one wavelength range of the beam;

a support configured to support a patterning device, the patterning device being configured to impart the beam of radiation with a pattern in its cross-section;

a substrate table configured to hold a substrate; and a projection system configured to project the patterned beam onto a target portion of the substrate.

6. A radiation collector comprising a plurality of grazing-incidence reflectors arranged to collect radiation emitted by a plasma and form a beam therefrom; and a filter constructed and arranged to attenuate at least one wavelength range of the beam, the filter comprising a diffraction grating formed on the grazing incidence reflectors of the collector with grooves oriented parallel to an optical axis of the radiation collector.

7. A radiation source comprising:

a bath constructed and arranged to contain a fuel for use as a plasma-forming material; and a wheel constructed an arranged to be at least partially immersed in, and rotatable within, said fuel, such that a rim of the wheel may be immersed, in use, in the fuel, the wheel being constructed and arranged to present a surface of the rim as a target for a radiation beam;

wherein a surface of the rim is curved across a width of the rim.

8. A source-collector device constructed and arranged to generate a radiation beam, comprising:

a first chamber and a second chamber, wherein gas, in use, is allowed to pass from one of the first chamber and second chamber to the other of the first chamber and second chamber;

the first chamber housing a plasma formation location and having a gas inlet for introducing gas into the first chamber and a gas outlet for removing gas from the first chamber and configured and arranged to produce a flow rate of gas through the first chamber between 15 slm and 200 slm;

the second chamber housing a grazing incidence radiation collector arranged to collect radiation generated, in use, at the plasma formation location, and to form a beam therefrom;

the source-collector device further comprising a contaminant trap constructed and arranged to reduce propagation of particulate contaminants generated at the plasma formation location to the grazing incidence radiation collector, the contaminant trap being located in-between the plasma formation location and the grazing incidence radiation collector;

the first chamber being arranged, in use, to contain gas at a first pressure, and the second chamber being arranged, in use, to contain gas at a second pressure, lower than the first pressure.

* * * * *